United States Patent
Wang et al.

(10) Patent No.: US 8,017,035 B2
(45) Date of Patent: *Sep. 13, 2011

(54) SILICATE-BASED YELLOW-GREEN PHOSPHORS

(75) Inventors: Ning Wang, Martinez, CA (US); Yi Dong, Tracy, CA (US); Shifan Cheng, Dublin, CA (US); Yi-Qun Li, Danville, CA (US)

(73) Assignee: Intematix Corporation, Fremont, CA (US)

( * ) Notice: Subject to any disclaimer, the term of this patent is extended or adjusted under 35 U.S.C. 154(b) by 708 days.

This patent is subject to a terminal disclaimer.

(21) Appl. No.: 11/963,994

(22) Filed: Dec. 24, 2007

(65) Prior Publication Data

US 2008/0116786 A1    May 22, 2008

Related U.S. Application Data

(63) Continuation of application No. 10/948,764, filed on Sep. 22, 2004, now Pat. No. 7,311,858, which is a continuation-in-part of application No. 10/912,741, filed on Aug. 4, 2004, now Pat. No. 7,267,787.

(51) Int. Cl.
*H01J 33/00*        (2006.01)
(52) U.S. Cl. .......... 252/301.4 F; 252/301.4 R; 313/503; 257/98
(58) Field of Classification Search ............ 252/301.4 F, 252/301.4 R; 313/503; 257/98
See application file for complete search history.

(56) References Cited

U.S. PATENT DOCUMENTS

| | | | |
|---|---|---|---|
| 3,505,240 | A | 4/1970 | Barry et al. |
| 5,998,925 | A | 12/1999 | Shimizu et al. |
| 6,093,346 | A | 7/2000 | Xiao |
| 6,501,100 | B1 | 12/2002 | Srivastava et al. |
| 6,504,179 | B1 | 1/2003 | Ellens et al. |
| 6,555,958 | B1 | 4/2003 | Srivastava et al. |
| 6,621,211 | B1 | 9/2003 | Srivastava et al. |

(Continued)

FOREIGN PATENT DOCUMENTS

EP    0972815    1/2000

(Continued)

OTHER PUBLICATIONS

Li, Y.Q., et al., "Luminescence Properties of Red-Emitting $M_2Si_5N_8:Eu^{2+}$(M=Ca, Sr, Ba) LED Conversion Phosphors," *Journal of Alloys and Compounds*, 417 (2006) 273-279.

(Continued)

*Primary Examiner* — Carol M Koslow
(74) *Attorney, Agent, or Firm* — Fliesler Meyer LLP

(57) ABSTRACT

Novel phosphor systems are disclosed having the formula $A_2SiO_4:Eu^{2+}D$, where A is at least one of a divalent metal selected from the group consisting of Sr, Ca, Ba, Mg, Zn, and Cd; and D is a dopant selected from the group consisting of F, Cl, Br, I, P, S, N, and B. In one embodiment, the novel phosphor has the formula $(Sr_{1-x-y}Ba_xM_y)_2SiO_4:Eu^{2+}F$ (where M is one of Ca, Mg, Zn, or Cd in an amount ranging from 0<y<0.5). The phosphor is configured to absorb visible light from a blue LED, and luminescent light from the phosphor plus light from the blue LED may be combined to form white light. The novel phosphors can emit light at intensities greater than either conventionally known YAG compounds, or silicate-based phosphors that do not contain the inventive dopant ion.

2 Claims, 18 Drawing Sheets

U.S. PATENT DOCUMENTS

| | | | |
|---|---|---|---|
| 6,649,946 | B2 | 11/2003 | Bogner et al. |
| 6,765,237 | B1 | 7/2004 | Doxsee et al. |
| 6,982,045 | B2 | 1/2006 | Menkara et al. |
| 7,023,019 | B2 | 4/2006 | Maeda et al. |
| 7,026,755 | B2 | 4/2006 | Setlur et al. |
| 7,229,573 | B2 | 6/2007 | Setlur et al. |
| 7,250,715 | B2 | 7/2007 | Mueller et al. |
| 7,252,787 | B2 | 8/2007 | Hancu et al. |
| 7,253,446 | B2 | 8/2007 | Sakuma et al. |
| 7,262,439 | B2 | 8/2007 | Setlur et al. |
| 7,311,858 | B2 * | 12/2007 | Wang et al. .............. 252/301.4 F |
| 2003/0006702 | A1 | 1/2003 | Mueller-Mach et al. |
| 2003/0227007 | A1 | 12/2003 | Ezuhara et al. |
| 2004/0104391 | A1 | 6/2004 | Maeda et al. |
| 2006/0028122 | A1 | 2/2006 | Wang et al. |
| 2006/0197432 | A1 | 9/2006 | Nagatomi et al. |
| 2006/0208262 | A1 | 9/2006 | Sakuma et al. |
| 2006/0255710 | A1 | 11/2006 | Mueller-Mach et al. |
| 2006/0261309 | A1 | 11/2006 | Li et al. |
| 2007/0037834 | A1 | 2/2007 | Arai et al. |

FOREIGN PATENT DOCUMENTS

| | | |
|---|---|---|
| WO | WO 03/021691 | 3/2003 |

OTHER PUBLICATIONS

Xie, Rong-Jun et al. "A Simple Efficient Synthetic Route to $Sr_2Si_5N_8:Eu^{2+}$-Based Red Phosphors for White Light-Emitting Diodes," *Chem Mater*. 2006, 18. 5578-5583.

Uheda, Kyota, et al., "Luminescence Properties of a Red Phosphor, $CaAlSiN_3:Eu^{2+}$ for White Light Emitting Diodes," Electrochemical and Solid-State Letters, 9 (4) H22-H25 (2006).

Piao, Xianqing, et al., "Preparation of $(Sr_{1-x}Ca_x)_2Si_5N_8/Eu^{2+}$ Solid Solutions and Their Luminescence Properties," Journal of the Electrochemical Society, 153 (12) H232-H235 (2006).

Li, Y.Q., et al., "Luminescence Properties of Red-Emitting $M_2Si_5N_8:Eu^{2+}$ (M=Ca, Sr, Ba) LED Conversion Phosphors," *Journal of Alloys and Compounds*, 417 (2006) 273-279.

International Search Report and Written Opinion dated Mar. 13, 2009 for International Application No. PCT/US08/87822.

\* cited by examiner

SILICATE-BASED YELLOW-GREEN PHOSPHORS

REFERENCE TO RELATED APPLICATION

The present application is a continuation-in-part of U.S. patent application Ser. No. 10/948,764, now U.S. Pat. No. 7,311,858, filed Sep. 22, 2004, and titled "Novel silicate-based yellow-green phosphors", which is a continuation in part of U.S. patent application Ser. No. 10/912,741, now U.S. Pat. No. 7,267,787, filed Aug. 4, 2004, and titled "Novel phosphor systems for a white light emitting diode (LED)." U.S. patent applications Ser. No. 10/912,741 (now U.S. Pat. No. 7,267,787) and 10/948,764 (now U.S. Pat. No. 7,311,858) are hereby incorporated by reference in their entirety.

BACKGROUND OF THE INVENTION

1. Field of the Invention

Embodiments of the present invention are directed in general to novel silicate-based yellow and/or green phosphors (herein referred to as yellow-green phosphors) for use in a white light illumination system such as a white light emitting diodes (LED). In particular, the yellow-green phosphors of the present invention comprise a silicate-based compound having at least one divalent alkaline earth element and at least one anion dopant, wherein the optical performance of the novel phosphors is equal to or exceeds that of either known YAG:Ce compounds or known silicate-based compounds that do not take advantage of the benefits of including an anion dopant.

2. State of the Art

White LED's are known in the art, and they are relatively recent innovations. It was not until LED's emitting in the blue/ultraviolet region of the electromagnetic spectrum were developed that it became possible to fabricate a white light illumination source based on an LED. Economically, white LED's have the potential to replace incandescent light sources (light bulbs), particularly as production costs fall and the technology develops further. In particular, the potential of a white light LED is believed to be superior to that of an incandescent bulbs in lifetime, robustness, and efficiency. For example, white light illumination sources based on LED's are expected to meet industry standards for operation lifetimes of 100,000 hours, and efficiencies of 80 to 90 percent. High brightness LED's have already made a substantial impact on such areas of society as traffic light signals, replacing incandescent bulbs, and so it is not surprising that they will soon provide generalized lighting requirements in homes and businesses, as well as other everyday applications.

There are several general approaches to making a white light illumination system based on light emitting phosphors. To date, most white LED commercial products are fabricated based on the approach shown in FIG. 1, where light from a radiation source does affect the color output of the white light illumination. Referring to the system 10 of FIG. 1, a radiation source 11 (which may be an LED) emits light 12, 15 in the visible portion of the electromagnetic spectrum. Light 12 and 15 is the same light, but is shown as two separate beams for illustrative purposes. A portion of the light emitted from radiation source 11, light 12, excites a phosphor 13, which is a photoluminescent material capable of emitting light 14 after absorbing energy from the source 11. The light 14 can be a substantially monochromatic color in the yellow region of the spectrum, or it can be a combination of green and red, green and yellow, or yellow and red, etc. Radiation source 11 also emits blue light in the visible that is not absorbed by the phosphor 13; this is the visible blue light 15 shown in FIG. 1. The visible blue light 15 mixes with the yellow light 14 to provide the desired white illumination 16 shown in the figure.

A known yellow phosphor that has been used in the art according to the scheme illustrated in FIG. 1 is a YAG-based phosphor having a main emission peak wavelength that varies in the range of about 530 to 590 nm depending on the composition, especially the amount of gadolinium (Gd) atoms substituting yttrium (Y) atoms constituting the YAG-based phosphor. Another factor that influences the main emission peak wavelength is the amount of the $Ce^{3+}$ added as a luminescent center. It is known that the peak emission wavelength shifts to longer wavelengths as either the substitution amount of Gd or the amount of $Ce^{3+}$ is increased. Color control of the white light may be accomplished by changing the output ratio between the blue light emitted by the blue LED and the yellow light emitted by the YAG-based phosphor.

U.S. Pat. No. 5,998,925 to Shimizu et al. discloses the use of a 450 nm blue LED to excite a yellow phosphor comprising a yttrium-aluminum-garnet (YAG) fluorescent material. In this approach a InGaN chip functions as a visible, blue-light emitting LED, and a cerium doped yttrium aluminum garnet (referred to as "YAG:Ce") serves as a single phosphor in the system. The phosphor typically has the following stoichiometric formula: $Y_3Al_5O_{12}:Ce^{3+}$. The blue light emitted by the blue LED excites the phosphor, causing it to emit yellow light, but not all the blue light emitted by the blue LED is absorbed by the phosphor; a portion is transmitted through the phosphor, which then mixes with the yellow light emitted by the phosphor to provide radiation that is perceived by the viewer as white light.

The YAG:Ce phosphors of the prior art have known disadvantages. One disadvantage is that when used in an illumination system it may contribute to production of white light with color temperatures ranging from 6,000 to 8,000 K, which is comparable to sunlight, and a typical color rendering index (CRI) of about 70 to 75. These specifications are viewed as a disadvantage because in some instances white light illumination systems with a lower color temperature are preferred, such as between about 3000 and 4100 K, and in other cases a higher CRI is desired, such as above 90. Although the color temperature of this type of prior art system can be reduced by increasing the thickness of the phosphor, the overall efficiency of the system decreases with such an approach.

Another yellow phosphor that has been used in the art according to the scheme illustrated in FIG. 2 is a silicate-based phosphor described by T. Maeda et al. in U.S. Patent Application Publication 2004/0104391 A1, published Jun. 3, 2004. In this publication, T. Maeda et al. describe a silicate-based phosphor according to the formula $(Sr_{1-a1-b1-x}Ba_{a1}Ca_{b1}Eu_x)_2SiO_4$, where $0 \leq a1 \leq 0.3$; $0 \leq b1 \leq 0.8$; and $0 < x < 1$. This yellow-yellowish phosphor emits a fluorescence having a main emission peak in the wavelength range from 550 to 600 nm, inclusive, with a wavelength range 560 to 590 nm being preferred. Still more preferable was a phosphor emitting a fluorescence having a main emission peak in the wavelength range 565 to 585 nm, both inclusive.

That the YAG-based phosphors exemplified by U.S. Pat. No. 5,998,925 to Shimizu et al., or the silicate-based phosphors of T. Maeda et al. in U.S. Patent Application Publication 2004/0104391 A1, can produce white light according to the visible excitation source scheme of FIG. 1, may be understood in part by studying an excitation spectra shown in FIG. 2, taken from the Maeda et al. patent application. FIG. 2 is a graph showing the excitation and emission spectra of Maeda et al.'s silicate phosphor and a YAG-based phosphor. Maeda et al.'s silicate based phosphor is a yellow (or yellow/yellowish, as they describe it) phosphor which has an excitation peak around 250 to 300 nm, and absorbs light in a wavelength range of 100 to 500 nm to emit a yellow/yellowish fluorescence having an emission peak in the 550 to 600 nm range; i.e., from yellow-green to yellow to orange. Accordingly, if light from the yellow/yellowish phosphor of Maeda et al. is combined with the blue light from a blue-light-emitting device, the resulting light is substantially white in nature.

Maeda et al. concede in FIG. 2 that their silicate phosphor has a low luminous efficacy, the luminous efficacy of their silicate-based phosphor being only half of that of a YAG-based phosphor under 470 nm excitation when the silicate-based phosphor is excited by blue light in the wavelength range greater than 430 nm and less than or equal to 500 nm. This necessitates the use of a larger amount of Maeda et al.'s phosphor relative to a YAG-based phosphor in order to obtain the same color of light according to the scheme of FIG. 2. In a description provided by Maeda et al., the luminescent layer is "relatively thick" compared to that which would have been used had the luminescent been a YAG-based phosphor. In this case the blue light intensity used as a part of white illumination will be significantly reduced by relative thick layer of Maeda et al's yellow phosphors.

What is needed is an improvement over the silicate-based, yellow phosphors of the prior art where the improvement is manifested at least in part by an equal or greater conversion efficiency from blue to yellow. The enhanced yellow phosphor with low gravity density and low cost may be used in conjunction with a blue LED to generate light whose color output is stable, and whose color mixing results in the desired uniform, color temperature and color rendering index.

SUMMARY OF THE INVENTION

Embodiments of the present invention are directed to novel silicate-based yellow and/or green phosphors (herein referred to as yellow-green phosphors) for use in a white light illumination system such as a white light emitting diodes (LED). In particular, the yellow-green phosphors of the present invention comprise a silicate-based compound having at least one divalent alkaline earth element and at least one anion dopant, wherein the optical performance of the novel phosphors is equal to or exceeds that of either known YAG:Ce compounds or known silicate-based compounds that do not take advantage of the benefits of including an anion dopant.

In one embodiment of the present invention, the novel silicate-based yellow-green phosphor has the formula $A_2SiO_4:Eu^{2+}D$, where A is at least one of a divalent metal selected from the group consisting of Sr, Ca, Ba, Mg, Zn, and Cd; and D is a dopant selected from the group consisting of F, Cl, Br, I, P, S, N, and B wherein D is present in the phosphor in an amount ranging from about 0.01 to 20 mole percent. It will be understood that not all of these dopants need be present at the same time; in fact, there may be only one type of dopant, or a combination of two or more types of dopants. This silicate-based phosphor is configured to absorb radiation in a wavelength ranging from about 280 nm to 490 nm, and emits visible light having a wavelength ranging from about 460 nm to 590 nm.

In an alternative embodiment, the silicate-based phosphor has the formula $(Sr_{1-x-y}Ba_xM_y)_2 SiO: Eu^{2+}D$, where M is at least one of an element selected from the group consisting of Ca, Mg, Zn, and Cd, and where $0 < x < 1$;
$0 < y < 1$ when M is Ca;
$0 < y < 1$ when M is Mg; and
$0 < y < 1$ when M is selected from the group consisting of Zn and Cd.

In one embodiment, the "D" ion in the silicate-based phosphor is chlorine, sulfur, and/or nitrogen.

In an alternative embodiment, the silicate-based has the formula $(Sr_{1-x-y}Ba_xM_y)_2 SiO_4: Eu^{2+}Cl,S,N,B$, where M is at least one of an element selected from the group of Ca, Mg, Zn,Cd, where the total amount of Cl, S, N, and B ranges from 0.0001-.02, and where $0 < x < 0.3$;
$0 < y < 0.5$ when M is Ca;
$0 < y < 0.1$ when M is Mg; and
$0 < y < 0.5$ when M is selected from the group consisting of Zn and Cd.

This phosphor emits light in the yellow region of the electromagnetic spectrum, and has a peak emission wavelength ranging from about 540 to 590 nm. Again, the nomenclature is mean to convey that at least one type dopant is present; or a combination of dopants, and not all (even more than one type) need be present.

In an alternative embodiment, the silicate-based phosphor has the formula $(Sr_{1-x-y}Ba_xM_y)_2 SiO_4: Eu^{2+}Cl,S,N,B$, where M is at least one of an element selected from the group consisting of Ca, Mg, Zn and Cd, where the total amount of Cl, S, N, and B ranges from 0.0001-.02, and where
$0.3 < x < 1$;
$0 < y < 0.5$ when M is Ca;
$0 < y < 0.1$ when M is Mg; and
$0 < y < 0.5$ when M is selected from the group consisting of Zn and Cd.

This silicate-based phosphor emits light in the green region of the electromagnetic spectrum, and has a peak emission wavelength ranging from about 500 to 540 nm. The silicate-based phosphor emits light in the green region of the electromagnetic spectrum, and has a peak emission wavelength ranging from about 500 to 530 nm.

In an alternative embodiment, a white light LED is disclosed, the white light LED comprising a radiation source configured to emit radiation having a wavelength ranging from about 410 to 500 nm; a yellow phosphor according to claim 2, the yellow phosphor configured to absorb at least a portion of the radiation from the radiation source and emit light with a peak intensity in a wavelength ranging from about 530 to 590 nm.

In an alternative embodiment, the white LED may comprise a radiation source configured to emit radiation having a wavelength ranging from about 410 to 500 nm; a yellow phosphor according to claim 2, the yellow phosphor configured to absorb at least a portion of the radiation from the radiation source and emit light with peak intensity in a wavelength ranging from about 530 to 590 nm; and a green phosphor according to claim 1, the green phosphor configured to absorb at least a portion of the radiation from the radiation source and emit light with peak intensity in a wavelength ranging from about 500 to 540 nm.

In an alternative embodiment, the white LED may comprise a radiation source configured to emit radiation having a wavelength ranging from about 410 to 500 nm; a green phosphor according to claim 1, the green phosphor configured to absorb at least a portion of the radiation from the radiation source and emit light with peak intensity in a wavelength ranging from about 500 to 540 nm; and a red phosphor selected from the group consisting of $CaS:Eu^{2+}$, $SrS:Eu^{2+}$, $MgO*MgF*GeO:Mn^{4+}$, and $M_xSi_yN_z:Eu^{+2}$, where M is selected from the group consisting of Ca, Sr, Ba, and Zn; $Z=\frac{2}{3}x+\frac{4}{3}y$, wherein the red phosphor is configured to absorb at least a portion of the radiation from the radiation source and emit light with peak intensity in a wavelength ranging from about 590 to 690 nm. Newer red phosphors include nitridosilicates, aluminonitridosilicates, oxynitridosilicates, and oxynitridoaluminosilicates. One general formula is $M_xSi_yN_z$:$Eu^{2+}$ where M is selected from the group consisting of Ca, Sr, Ba, and Zn; and $Z=\frac{2}{3}x+\frac{4}{3}y$. Other examples include:

$M_2Si_5N_8$:$Eu^{2+}$, where M is Ca, Sr, and Ba;

$CaSiN_2$:$Eu^{2+}$ $CaAlSiN_3$:$Eu^{2+}$ $(Ca_{1-x-y-z}Sr_xBa_yMg_z)_{1-n}(Al_{1-a+b}B_a)Si_{1-b}N_{3-b}O_b$:$RE_n$, where $0 \leq x \leq 1$, $0 \leq y \leq 1$, $0 \leq z \leq 1$, $0 \leq a \leq 1$, $0 < b \leq 1$, $0.002 \leq n \leq 0.2$, and RE is selected from the group consisting of $Eu^{2+}$ and $Ce^{3+}$.

In an alternative embodiment, the white LED may comprise a radiation source configured to emit radiation having a wavelength ranging from about 410 to 500 nm; a yellow phosphor according to claim 2, the yellow phosphor configured to absorb at least a portion of the radiation from the radiation source and emit light with a peak intensity in a wavelength ranging from about 540 to 590 nm; and a red phosphor selected from the group consisting of CaS:$Eu^{2+}$, SrS:$Eu^{2+}$, MgO*MgF*GeO:$Mn^{4+}$, and $M_xSi_yN_z$:$Eu^{+2}$, where M is selected from the group consisting of Ca, Sr, Ba, and Zn; and $Z=\frac{2}{3}x+\frac{4}{3}y$, and the newer red phosphors described above, wherein the red phosphor is configured to absorb at least a portion of the radiation from the radiation source and emit light with peak intensity in a wavelength ranging from about 590 to 690 nm.

Further embodiments of the composition comprise a silicate-based yellow phosphor having the formula $A_2SiO_4$:$Eu^{2+}$D, wherein A is at least one divalent metal selected from the group consisting of Sr, Ca, Ba, Mg, Zn, and Cd; and D is an ion that is present in the yellow phosphor in an amount ranging from about 0.01 to 20 mole percent; and a blue phosphor; wherein the yellow phosphor is configured to emit visible light with a peak intensity in a wavelength ranging from about 540 nm to 590 nm; and the blue phosphor is configured to emit visible light with a peak intensity in a wavelength ranging from about 430 to 510 nm. The blue phosphor of the composition is selected from the group consisting of silicate-based phosphors and aluminate-based phosphors. The composition of the silicate-based blue phosphor may have the formula $Sr_{i-x-y}Mg_xBa_ySiO_4$:$Eu^{2+}$F; and where $0.5 < x < 1.0$; and $0 < y < 0.5$.

Alternatively, the composition of the aluminate-based blue phosphor may have the formula $Sr_{i-x}MgEu_xAl_{10}O_{17}$; and where $0.01 < x < 1.0$.

In an alternative embodiment, a composition comprises a silicate-based green phosphor having the formula $A_2SiO_4$:$Eu^{2+}$D, wherein A is at least one of a divalent metal selected from the group consisting of Sr, Ca, Ba, Mg, Zn, and Cd; and D is a negatively charged halogen ion that is present in the yellow phosphor in an amount ranging from about 0.01 to 20 mole percent; a blue phosphor; and a red phosphor; wherein the green phosphor is configured to emit visible light with a peak intensity in a wavelength ranging from about 500nm to 540 nm; the blue phosphor is configured to emit visible light with a peak intensity in a wavelength ranging from about 430 to 510 nm; and the red phosphor is configured to emit visible light with a peak intensity in a wavelength ranging from about 575 to 690 nm.

In an alternative embodiment, methods are provided for preparing a silicate-based yellow phosphor having the formula $A_2SiO_4$:$Eu^{2+}$D, wherein A is at least one of a divalent metal selected from the group consisting of Sr, Ca, Ba, Mg, Zn, and Cd; and D is a dopant selected from the group consisting of F, Cl, Br, I, P, S, N, and B, wherein D is present in the phosphor in an amount ranging from about 0.01 to 20 mole percent, the method selected from the group consisting of a sol-gel method and a solid reaction method.

Methods for preparing the novel phosphors include sol-gel methods, which comprises the steps of:

a) dissolving a desired amount of an alkaline earth nitrate selected from the group consisting of Mg, Ca, Sr, and Ba-containing nitrates with $Eu_2O_3$ and a compound selected from the group consisting of $BaF_2$, $NH_4F$, an alkaline earth metal halide, and an ammonium halide, in an acid, to prepare a first solution;

b) dissolving corresponding amount of a silica gel in deionized water to prepare a second solution;

c) stirring together the solutions produced in steps a) and b), and then adding ammonia to generate a gel from the mixture solution;

d) adjusting the pH of the solution produced in step c) to a value of about 9, and then stirring the solution continuously at about 60° C. for about 3 hours;

e) drying the gelled solution of step d) by evaporation, and then decomposing the resulting dried gel at 500 to 700° C. for about 60 minutes to decompose and acquire product oxides;

f) cooling and grinding the gelled solution of step e) to produce a powder;

g) calcining/sintering the powder of step f) in a reduced atmosphere for about 6 to 10 hours, wherein the sintering temperature ranged from about 1200 to 1400° C.

In a method that involves a solid reaction method, the steps comprise:

a) wet mixing desired amounts of alkaline earth oxides or carbonates (Mg, Ca, Sr, Ba), $Eu_2O_3$, and a dopant selected from the group consisting of $BaF_2$, $NH_4F$, an alkaline earth metal halide, and ammonium halide, and corresponding $SiO_2$;

b) after drying and grinding, calcining and sintering the resulting powder in a reduced atmosphere for about 6 to 10 hours, wherein the calcining/sintering temperature ranged from about 1200 to 1400° C.

DETAILED DESCRIPTION OF THE INVENTION

Figure 1:
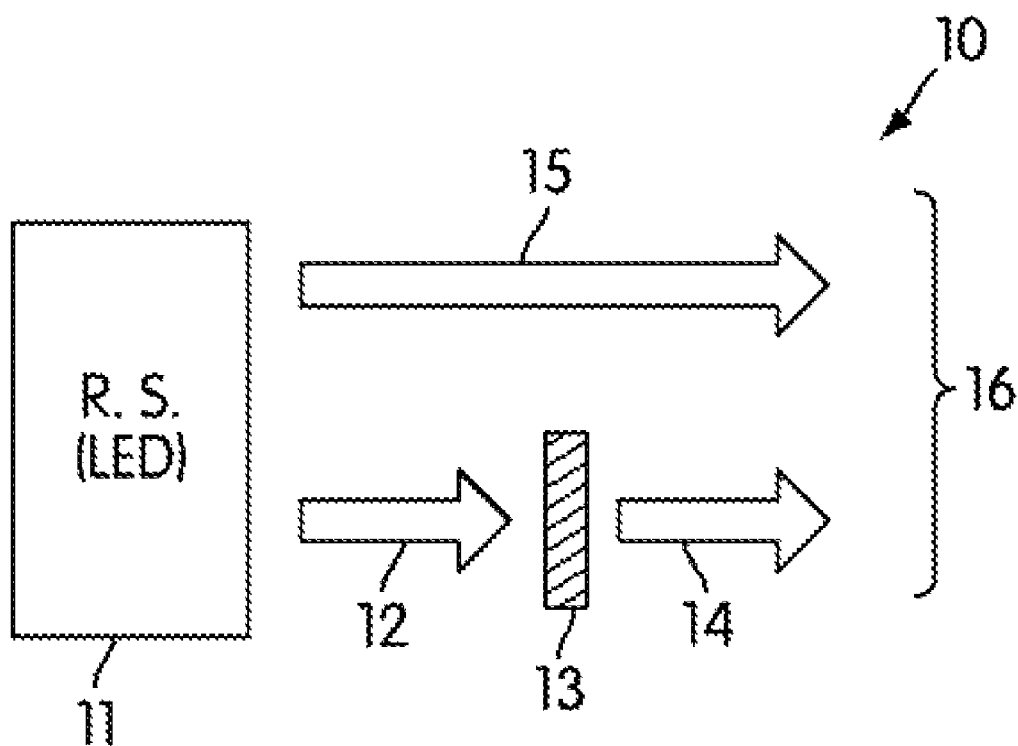
FIG. 1 is a schematic representation of a general scheme for constructing a white light illumination system, the system comprising a radiation source that emits in the visible, and a phosphor that emits in response to the excitation from the radiation source, wherein the light produced from the system is a mixture of the light from the phosphor and the light from the radiation source.
Figure 2:
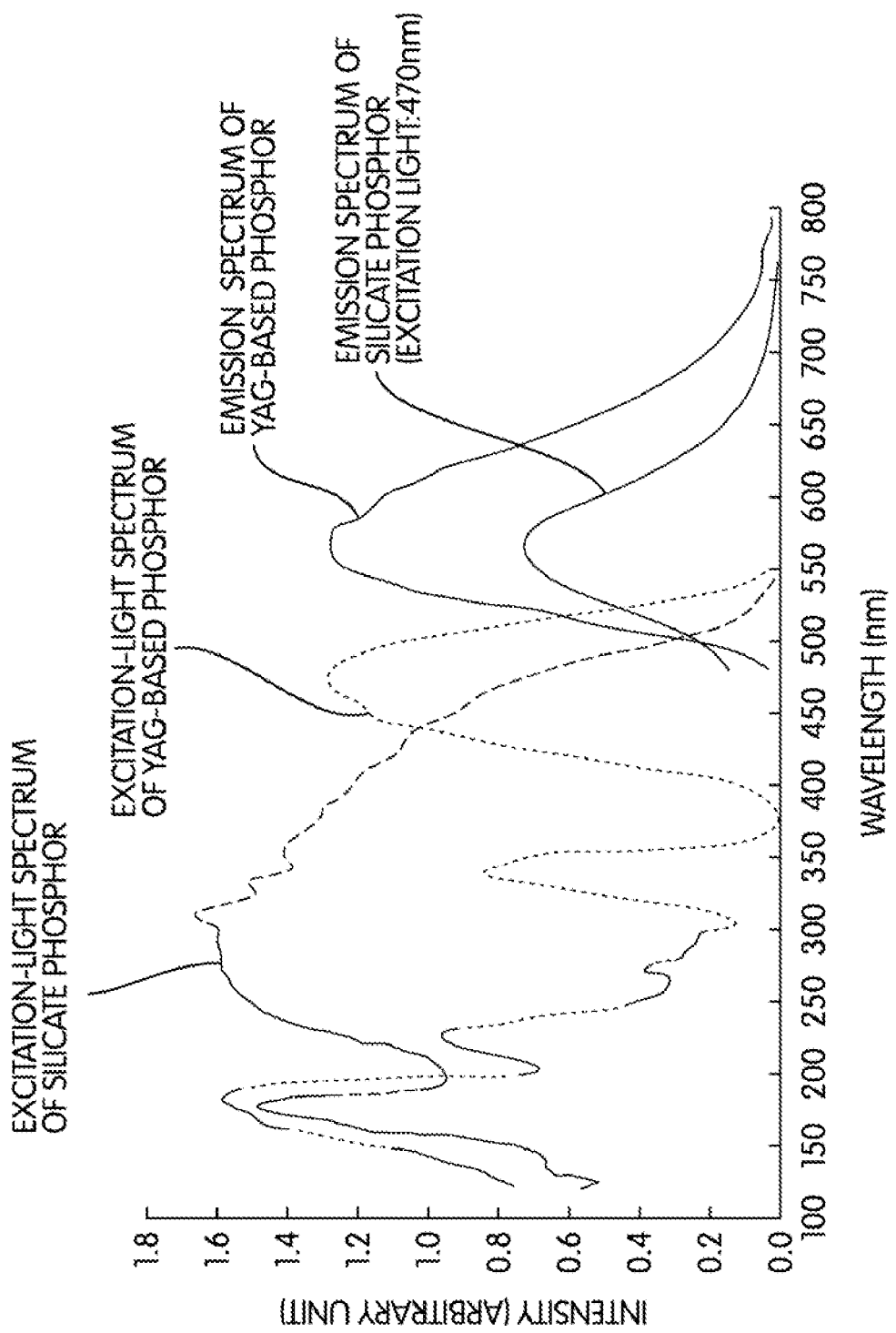
FIG. 2 is an excitation spectrum plotted as a function of wavelength for a prior art YAG-based phosphor and a prior art silicate-based phosphor; included in the graph is an emission spectra measured from each of two prior art yellow phosphors, where both have been excited with radiation having a wavelength of 470 nm.

Embodiments of the present invention will be described in the following order: first, a general description of the novel silicate-based phosphor will be given, particularly with respect to selection of the dopant anion and reasons for its inclusion, and benefits especially in terms of enhanced emission intensity; the alkaline earths present in the phosphor, and the effect their content ratios has on luminescent properties; and the effects that temperature and humidity have on the phosphor. Next, phosphor processing and fabrication methods will be discussed. Finally, the white light illumination that may be produced using the novel yellow-green phosphor will be disclosed by first discussing the general characteristics of a blue LED, followed by a discussion of other phosphors that may be used in tandom with the novel yellow-green phosphor, such as, in particular, a red phosphor.

The Novel Yellow Phosphors of the Present Embodiments

According to embodiments of the present invention, a yellow phosphor having the formula $A_2SiO_4:Eu^{2+}D$ is disclosed, wherein A is at least one of a divalent metal selected from the group consisting of Sr, Ca, Ba, Mg, Zn, and Cd; and D is a negatively charged ion, present in the phosphor in an amount ranging from about 0.01 to 20 mole percent. There may be more than one of the divalent metal A present in any one phosphor. In a preferred embodiment, D is a dopant ion selected from the group consisting of F, Cl, Br, and I, but D can also be an element such as N, S, P, As, Sb, and B. The silicate-based phosphor is configured to absorb an excitation radiation having a wavelength ranging from about 280 nm to 520 nm, and particularly from wavelengths in the visible portion of that range such as from 430 to 480 nm. For example, the present silicate-based phosphor is configured to emit visible light having a wavelength ranging from about 460 nm to 590 nm, and has the formula $(Sr_{1-x-y}Ba_xCa_yEu_{0.02})_2 SiO_{4-z}D_z$; and where $0<x<1.0$, $0<y<0.8$, and $0<z<0.2$. An alternative formula is $(Sr_{1-x-y}Ba_xMg_yEu_{002})_2 SiO_{4-z}D_z$, where $0<x<1.0$, $0<y<0.2$, and $0<z<0.2$. In an alternative embodiment, the phosphor may be described by the formula $(Sr_{1-x-y}Ba_xM_y)_2 SiO_4: Eu^{2+}D$, where $0<x<1$, and M is one or more of Ca, Mg, Zn, Cd. In this embodiment, the condition $0<y<0.5$ applies when M is Ca; $0<y<0.1$ when M is Mg; and $0<y<0.5$ when M is either Zn or Cd. In a preferred embodiment, the component D is the element fluorine (F).

Exemplary phosphors were fabricated according to the present embodiments, and characterized optically in a variety of ways. First, and perhaps most revealing, were tests conducted to evaluate the intensity of the light emitted from the phosphor as a function of wavelength, wherein the test was carried out on a series of phosphor compositions that varied in the content of the D anion. From this data, it is useful to construct a graph of peak emission intensities, as a function of D anion content. Also useful is the construction of a graph of peak emission wavelength, again as a function of D anion content. Finally, it is possible to investigate the role that the divalent metal plays in phosphor performance; specifically, a series of compositions may be fabricated that contain two alkaline earth elements $A_1$ and $A_2$, sometime with an additional (or third) alkaline earth element $A_3$, and emission spectra as a function of wavelength may be measured for the different alkaline earths. In the case of two alkaline earths, in other words, the ratio of $A_1/A_2$ content may be varied.

Exemplary data is shown in FIGS. 3-6. The phosphor chosen to illustrate the inventive concept was a yellow-green phosphor of the family $[(Sr_{1-x}Ba_x)_{0.98}Eu_{0.02}]_2SiO_{4-y}D_y$. In other words, it will be understood by those skilled in the art that the alkaline earth components ($A_1$ and $A_2$) in these exemplary compositions are Sr and Ba; that it is an $Eu^{2+}$ activated system, and that the D anions chosen for these compositions are F and Cl. Although "D" has been consistently referred to as an anion in this disclosure, it is possible for a cation to be incorporated into the structure. The results of such a composition are shown as well in FIG. 5, where the inclusion of phosphorus is compared to the results obtained for chlorine and fluorine.

Figure 3:
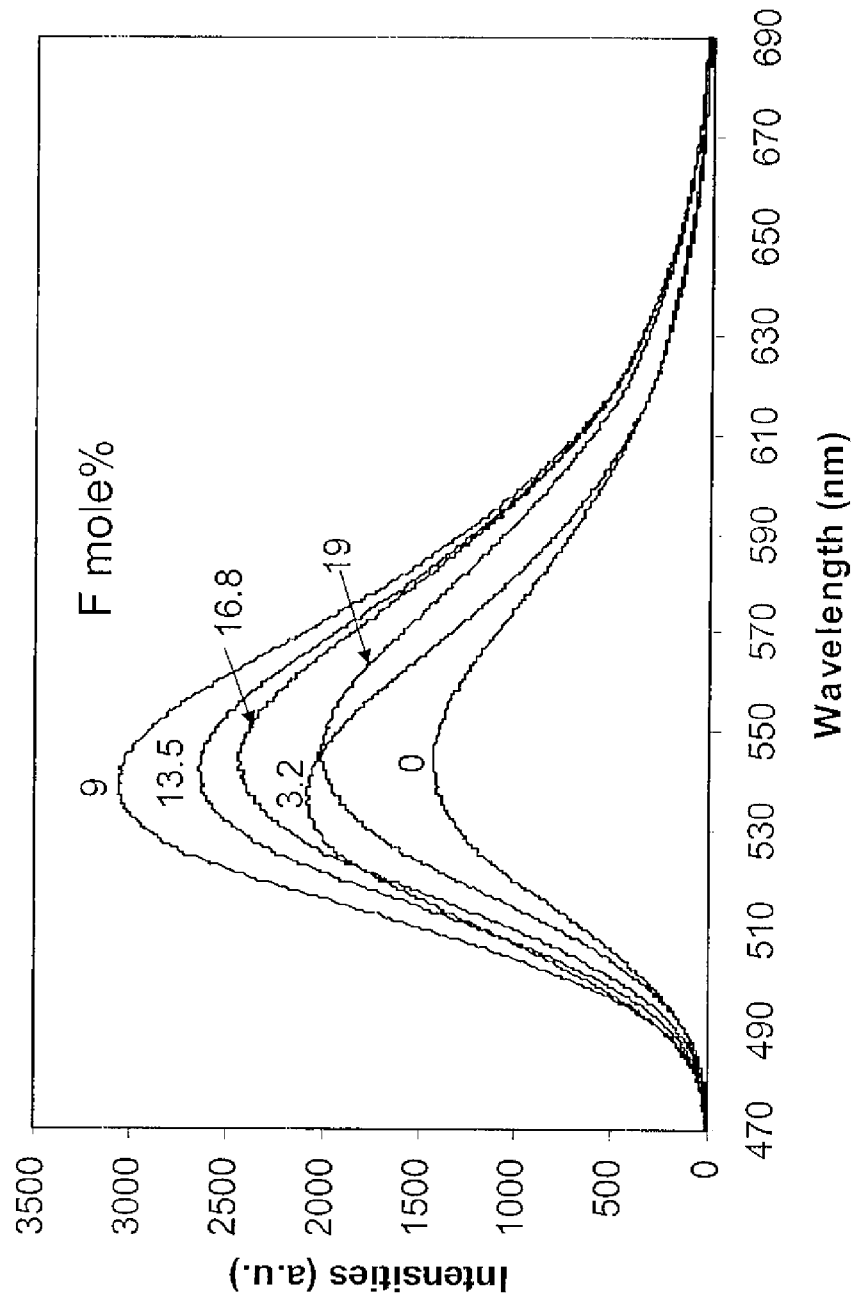
FIG. 3 shows a collection of emission spectra of exemplary phosphors according to the embodiments of the present invention, the compositions varying in fluorine content but conforming to the formula $[(Sr_{0.7}Ba_{0.3})_{0.98}Eu_{0.02}]_2SiO_{4-x}F_x$, where the wavelength of the excitation radiation used in the experiment was about 450 nm.
Figure 4:
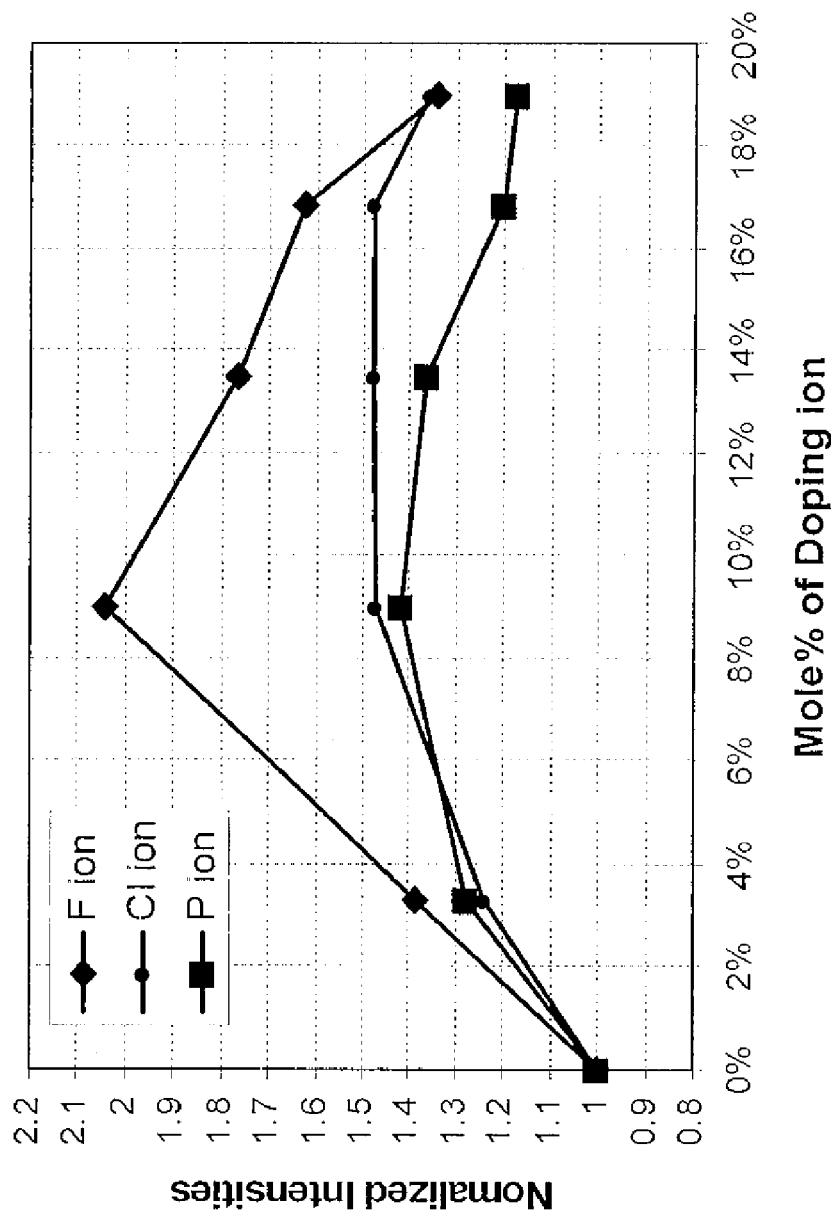
FIG. 4 is a graph of emission intensities versus doping concentration of the ion (D) for exemplary compositions having the formula $[(Sr_{0.7}Ba_{0.3})_{0.98}Eu_{0.02}]_2SiO_{4-x}D_x$, where D in this experiment is F, Cl, or P.
Figure 5:
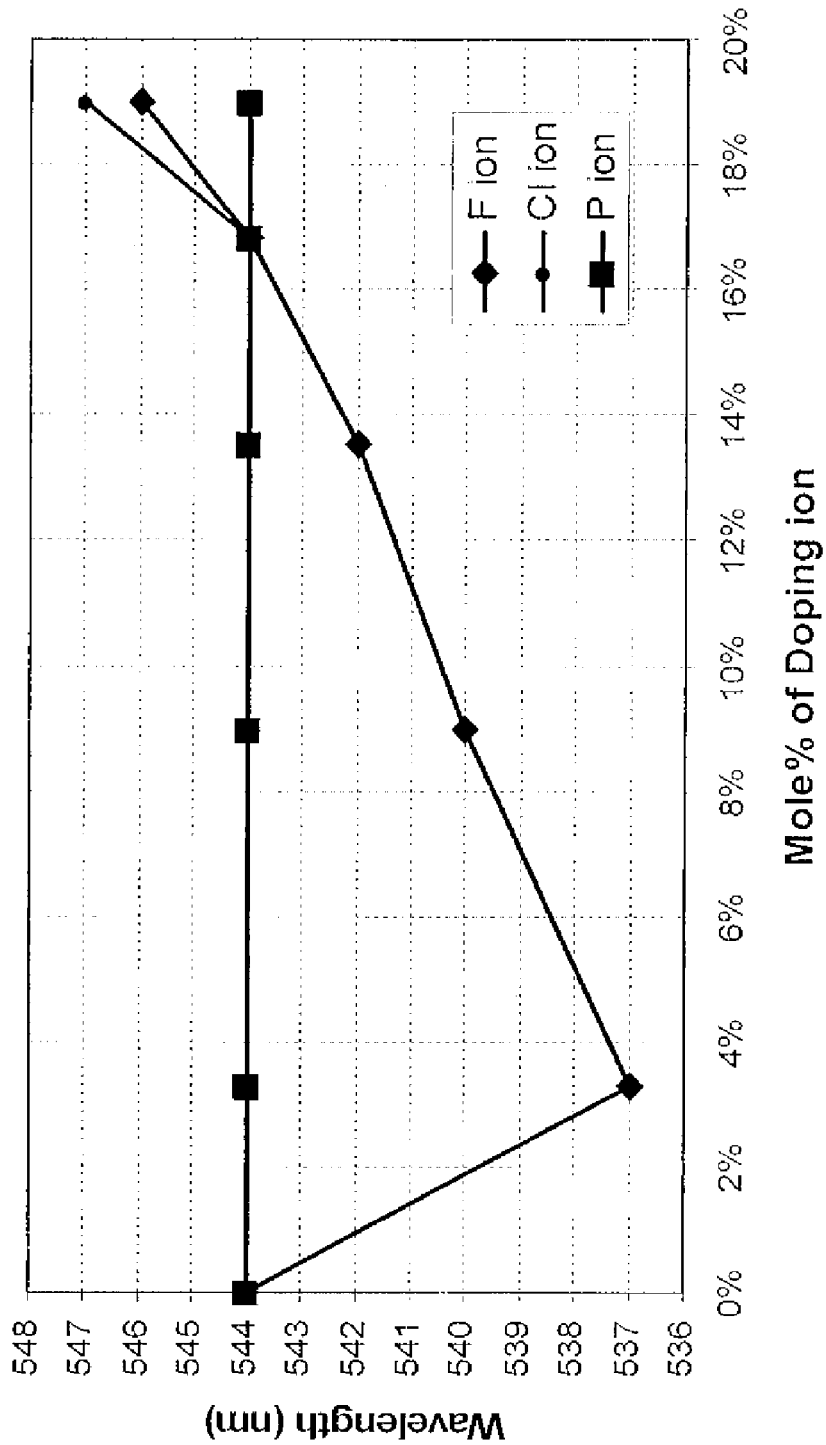
FIG. 5 is a graph of the peak wavelength position versus doping concentration of the anion (D) for exemplary compositions having the formula $[(Sr_{0.7}Ba_{0.3})_{0.98}Eu_{0.02}]_2SiO_{4-x}D_x$, where D in this experiment is F, Cl, or P.

The effect of the inclusion of the D anion dopant into the phosphor, where D is fluorine (F) in an exemplary composition, is seen in FIGS. 3-5. Referring to FIG. 3, the emission spectra was taken of a series of six compositions for the composition $[(Sr_{0.7}Ba_{0.3})_{0.98}Eu_{0.02}]_2SiO_{4-x}D_x$, where the mole percent (mol %) of the fluorine was 0, 3.2, 13.5, 9.0, 16.8, and 19.0, respectively. The wavelength of the excitation radiation in this experiment was 450 nm, and so light from this blue LED may be considered to contribute to the subsequently produced white light illumination. The results of FIG. 3 show that the emission intensity from this phosphor is significantly increased by doping the compositions with fluorine for concentrations up to about 10 mol %, at which point the intensity begins to fall off as the fluorine concentration is increased further.

The data from FIG. 3 may be plotted in a slightly different way: the value of the emission intensity at the maximum of each of the peaks may be plotted as a function of fluorine content, as shown for F using the triangle symbols in FIG. 4. For example, since the curve in FIG. 3 exhibiting the highest intensity occurred for the composition having a fluorine content of 9 mol %, the highest point of the F-ion curve in FIG. 4 occurs at a location on the x-axis also at 9 mol %. What makes FIG. 4 interesting (and the reason for plotting the data in this manner), is that such a plot allows different D anions to be compared. Referring to FIG. 4, normalized peak emission intensities have been plotted as a function of doping concentration of the anions fluorine (triangles), chlorine (circles), and phosphorus (squares), again where the host phosphor comprised a silicate with Sr and Ba alkaline earth components in mole ratio 0.7 and 0.3, respectively.

The data in FIG. 4 shows that the fluorine anion is most capable of increasing emission intensity, relative to P and Cl, and in this particular system under study. It is interesting to note that the F and P compositions both peaked at about 9 mol %, whereas the Cl emission intensity was relatively constant over the range 9 to 17 mol %, and may even have shown a slight increase over the 9 to 17 mol % range. It should also be noted that whereas the increase offered by the Cl and P compositions is significant, being about a 40 to 50% in normalized intensity at an optimized concentration, the advantage may not appear to be significant only because of the huge increase of 100% that the F composition displayed. Furthermore, there may be advantages offered by the relatively flat curve of the Cl composition, in this instance, where fabrication difficulties and/or inconsistencies in content tolerances may be ignored because of the relative constant nature of the emission over a range of compositions (e.g., Cl content ranging from 9 to 17 mol %).

Figure 6:
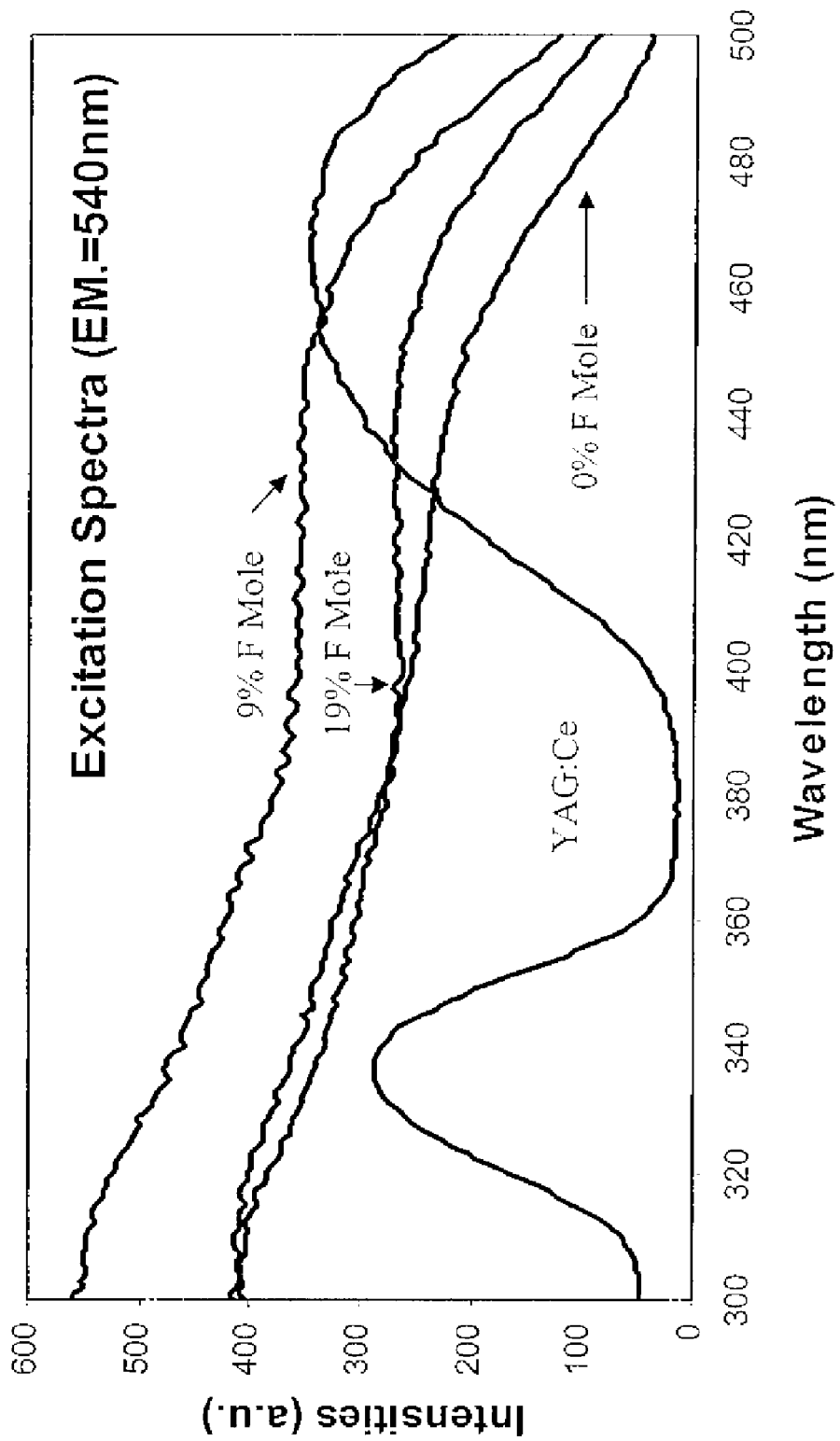
FIG. 6 is a graph of the excitation spectra comparing fluorine containing silicates and non-fluorine containing silicates, further confirming the role that fluorine plays in the present embodiments.

Just as normalized peak emission intensity may be plotted as a function of doping concentration for a series of D anion or cation (in this case, F, Cl, or P) compositions, so too may the wavelength at which that peak emission occurs be plotted as a function of wavelength. This data is shown in FIG. 5, again for the family of compositions $[(Sr_{0.7}Ba_{0.3})_{0.98}Eu_{0.02}]_2 SiO_{4-x}D_x$, where D is either an F, Cl, or P anion. As before, the wavelength of the excitation radiation was about 450 nm. The results of FIG. 5 show that the peak emission wavelength does not significantly vary with concentration for P, but does decrease for F and Cl with increasing dopant concentration to a value between about 2 and 4 mol %, steadily increasing thereafter. FIG. 6 is an example of excitation (absorption) spectra from an exemplary phosphor, tested with an excitation wavelength of about 450 nm, affected by fluorine content in the inventive silicate based phosphors. It showed clearly again that the fluorine dramatically changed the excitation spectra of silicate phosphors, in particular for the wavelength range from about 400 nm to 500 nm. This has a tremendous impact on white LED applications, since the 100 percent increase in excitation intensity at the excitation wavelength 430 to 490 nm of blue LED was achieved with only about 10 percent increase (mole percent) in fluorine concentration.

The effects that the inclusion of the D anion component into the phosphor have been discussed in FIGS. 3-5. Before preceeding to a disclosure of the effects of the alkaline earth component, a brief discussion of the role that the D anion plays in the composition will be given.

The Role that the Ion Dopant (D) Plays in the Yellow Phosphor

The effect of the inclusion of the anion D into the phosphor is highlighted by FIG. 3, which shows a collection of emission spectra of exemplary yellow phosphors varying in fluorine content. The wavelength of the excitation radiation used in the experiment was about 450 nm. In one embodiment, fluorine is added to the phosphor composition in the form of a $NH_4F$ dopant. The present inventors have found that when the $NH_4F$ dopant amount is very small (about 1%), the position of the peak emission is located at shorter wavelengths, and as more $NH_4F$ is added, the wavelength increases with dopant amount. The luminescence of the Eu doped phosphor is due to the presence of the $Eu^{2+}$ in the compound, which undergoes an electronic transition from $4f^65d^1$ to $4f^7$. The wavelength positions of the emission bands depend very much on the host's material or crystal structure, changing from the near-UV to the red region of the spectrum. This dependence is interpreted as due to the crystal field splitting of the 5d level. With increasing crystal field strength, the emission bands shift to longer wavelength. The luminescence peak energy of the 5d-4f transition is affected most by crystal parameters denoting electron-electron repulsion; in other word, the distance between $Eu^{2+}$ cation and surrounding anions, and the average distance to distant cations and anions.

In the presence of small amounts of $NH_4F$, the fluorine anion dopant functions predominantly as a flux during sintering processing. Generally, a flux improves sintering processing in one of two ways: the first is to promote crystal growth with the liquid sintering mechanism, and the second is to absorb and collect the impurities from the crystal grains and improve the phase purity of the sintered materials. In one embodiment of the present invention, the host phosphor is $(Sr_{1-x}Ba_x)_2SiO_4$. Both Sr and Ba are very large cations. There may be present smaller cations such as Mg and Ca, which may be considered to be impurities. Therefore, further purification of host lattice will lead to more perfect symmetric crystal lattice and a larger distance between cations and anions, with a result of a weakening of the crystal field strength. This is the reason that small amount doping of $NH_4F$ moves the emission peak to shorter wavelength. The emission intensity increases with this small amount of F doping attributes to a higher quality crystal with fewer defects.

When the amounts of $NH_4F$ are increased even further, some of the $F^-$ anions will replace $O^{2-}$ anions, and become incorporated into the lattice. Cation vacancies will be created in order to maintain an electrical charge neutrality. Since the vacancies in the cation positions reduce the average distance between cations and anions, the crystal field strength will be increased. Therefore, the peak of the emission curves will move to longer wavelength as the $NH_4F$ content increases due to the increased number of cation vacancies. The emission wavelength is directly related to the energy gap between ground and excitation states which is determined only by the crystal field strength. The result of emission wavelength increases with the fluorine and chlorine is strong evidence of fluorine or chlorine incorporating into the host lattice, most likely in substitute of oxygen sites. On the other hand, the addition of a phosphate ion does not substantially change the emission wavelength, as expected. This is again evidence that phosphate acts as a cation, will not replace oxygen, and thus will not be easily incorporated into the lattice to change the host material's crystal field strength. This is particularly true of the crystal field surrounding the $Eu^{2+}$ ions, which consist essentially of oxygen sites. The improvement in the emission intensity gained by adding $NH_4H_2PO_4$ indicates that it works a flux agent as discussed above.

The excitation spectra comparing fluorine containing silicates and non-fluorine containing silicates, as shown in FIG. 6, further confirmed the critical role that fluorine plays in the present embodiments of the present halide containing silicate phosphors. The excitation spectra shown in FIG. 6 is obtained by plotting the emission intensity at the wavelength of 540 nm verses an excitation wavelength. The excitation intensity is directly related to the absorption and determined by excitation and transmission probability between excitation level and ground level. The dramatic increase in excitation intensity above 400 nm by introduction of fluorine into the silicate phosphor indicates again strongly that fluorine incorporates into the silicate lattice and changed dramatically the symmetrical surrounding of $Eu^{+2}$ to nonsymmetrical structure, which directly increases the probability of emission and transmission between emission sate to ground state. From FIG. 6 one skilled in the art may see that about 10 mol % fluorine in silicate phosphor can increase about 100% emission intensity of non-fluorine contained silicate phosphor in the excitation wavelength from 450 to 480 nm which is the most important for white LED applications.

The emission intensity decreases or levels off when the halide concentration increases more than 10 mol % as shown in FIG. 3. This can be explained by Eu emission quenching due to the fact that more defects introduced in associated with the fluorine incorporation into the lattice, the more non-radiation centers will be created to reduce the absorbed energy transferring to $Eu^{2+}$ effective emission centers. The result in FIG. 3 indicates the maximum intensity increase by fluorine without Eu emission quenching is about 10 mol %.

Effect of the Alkaline Earth Component

Figure 7:
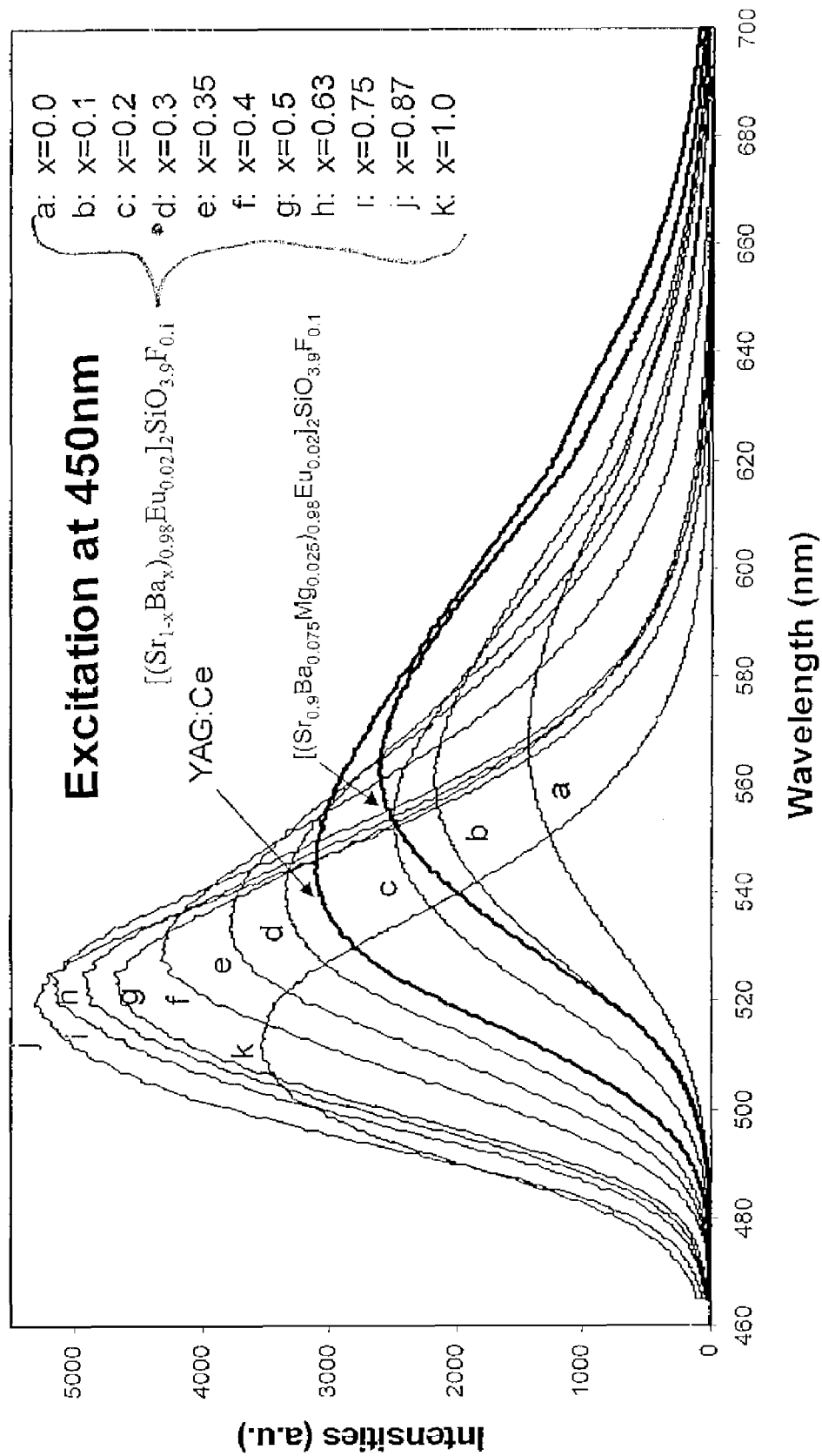
FIG. 7 shows a collection of emission spectra for exemplary phosphors having the formula $[(Sr_{1-x}Ba_x)_{0.98}Eu_{0.02}]_2 SiO_{4-y}D_y$, illustrating how both peak intensity and wavelength position change as a function of the ratio of the two alkaline earths Sr and Ba.

The optical properties of the inventive yellow phosphor may be controlled, in addition to the methods discussed above, by adjusting the ratio of the alkaline earth elements contained within the phosphor. An exemplary data set that puts this embodiment of the inventive concept into place is illustrated in FIG. 7. Before turning to FIG. 7, however, it may be useful to discuss the general effects of typical alkaline earths on the crystal structure of the phosphor, which in turn will affect optical properties, where the alkaline earths under consideration are Sr, Ba, Ca, and Mg.

T. Maeda et al. do not teach the benefits of the present dopant ion D in U.S. Patent Application Publication 2004/0104391. Many of the principles pertaining to the alkaline earth content, however, still apply. Maeda et al. teach that when the content of Ba and Ca in a silicate phosphor is very small; in other words, when the content of the alkaline earths in the phosphor is mostly Sr, then the phosphor is likely to assume a monoclinic structure, or a structure comprising a mixture of monoclinic and orthorhombic crystal structures. When Ba is put into the phosphor at higher values than desired with little or no Ca, the crystal field around $Eu^{2+}$ions is weak. If the Ba content is low and the Ca content is higher than desired, the crystal structure is again likely to be monoclinic. Finally, if both the Ba and Ca contents are larger than desired, relative to the amount of Sr in the phosphor, then the silicate-based phosphor is likely to have a hexagonal structure. In each of these cases, according to Maeda et al., the phosphor is expected to be greener, and emits light with a low color purity for yellow.

T. Maeda et al. teach that in order to obtain yellow light from the phosphor, which may be defined as light having a wavelength ranging from about 550 to 600 nm, the desired Ba content in the phosphor should be in a mole fraction from about 0 to 0.3. With regard to the Ca content, the desired condition for obtaining yellow wavelengths lies from about 0 to 0.6, although they conjecture that yellow wavelengths may also be obtained from a compound in which the Ca substitution (for Sr) has a mole fraction of about 0.7. Maeda et al. note that compounds that do not contain any Sr do not emit yellow light.

The present inventors have completed an investigation of the composition space $(Sr_{1-x-y-z}Ba_xCa_yMg_z)_2SiO_4$ (where x+y+z=1) to enhance luminescent properties. In this case the particular interest was to optimize the material configured to emit green to yellow color light by blue excitation. The effects of stoichiometric ratio of calcium, strontium and barium on luminescent properties were found in consistent with Maeda et al's results disclosed in their patent. However, the present invention is more focused on the improvements of emission intensity while controlling the emission wavelength in the desired green to yellow region. FIG. 7 is a graph of the emission spectra of exemplary yellow-green phosphors belonging to the family $[(Sr_{0.7}Ba_{0.3})_{0.98}Eu_{0.02}]_2SiO_{3.9}F_{0.1}$, where the value of the strontium content in the series varies from 0 to 12, 25, 37, 50, 60, 65, 70, 80, 90, and 100 percent. Plotted another way, the value of x in the formula $Sr_{1-x}Ba_x$ ranges from 0, 0.1, 0.2, 0.3, 0.35, 0.4, 0.5, 0.63, 0.75, 0.87, and 1.0. Also plotted for comparison is a prior art YAG:Ce phosphor. The present study of the effects of alkaline metals on luminescent properties of silicate phosphors may be summarized as follows:

(1) In $(Sr_{1-x}Ba_x)_2SiO_4$ phosphor materials, the emission peak wavelength changes from green at 500 nm for x=1 (100% Ba) to yellow at 580 nm for x=0 (100% Sr) as shown in FIG. 7. The conversion efficiency from the same light source at 450 nm shows a continuous increase when the Ba increases from 0 to about 90%. The peak emission wavelength of 545 nm obtained when Ba to Sr ratio is 0.3 to 0.7 is close to the pure YAG:Ce peak emission wavelength as compared in FIG. 7.

(2) Calcium substitution of barium or strontium in the Sr—Ba based silicate phosphor system will in general reduce the emission intensity, even they can be favored for moving the emission to longer wavelength when calcium substitution is less than 40%.

(3) Magnesium substitution of barium or strontium in the Sr—Ba based silicate phosphors will in general reduce the emission intensity and move the emission to shorter wavelengths. However, the small amount of magnesium substitution of barium or strontium (<10%) will enhance the emission intensity and move the emission to longer wavelengths. For example, five percent of substitution of barium by magnesium in $(Sr_{0.9}Ba_{0.1})_2SiO_4$ will increase the emission intensity and move to a slightly longer wavelength, as shown in FIG. 7 for the curve labeled $[(Sr_{0.9}Ba_{0.075}Mg_{0.025})_{0.98}Eu_{0.02}]_2SiO_{3.9}F_{0.1}$.

Figure 8:
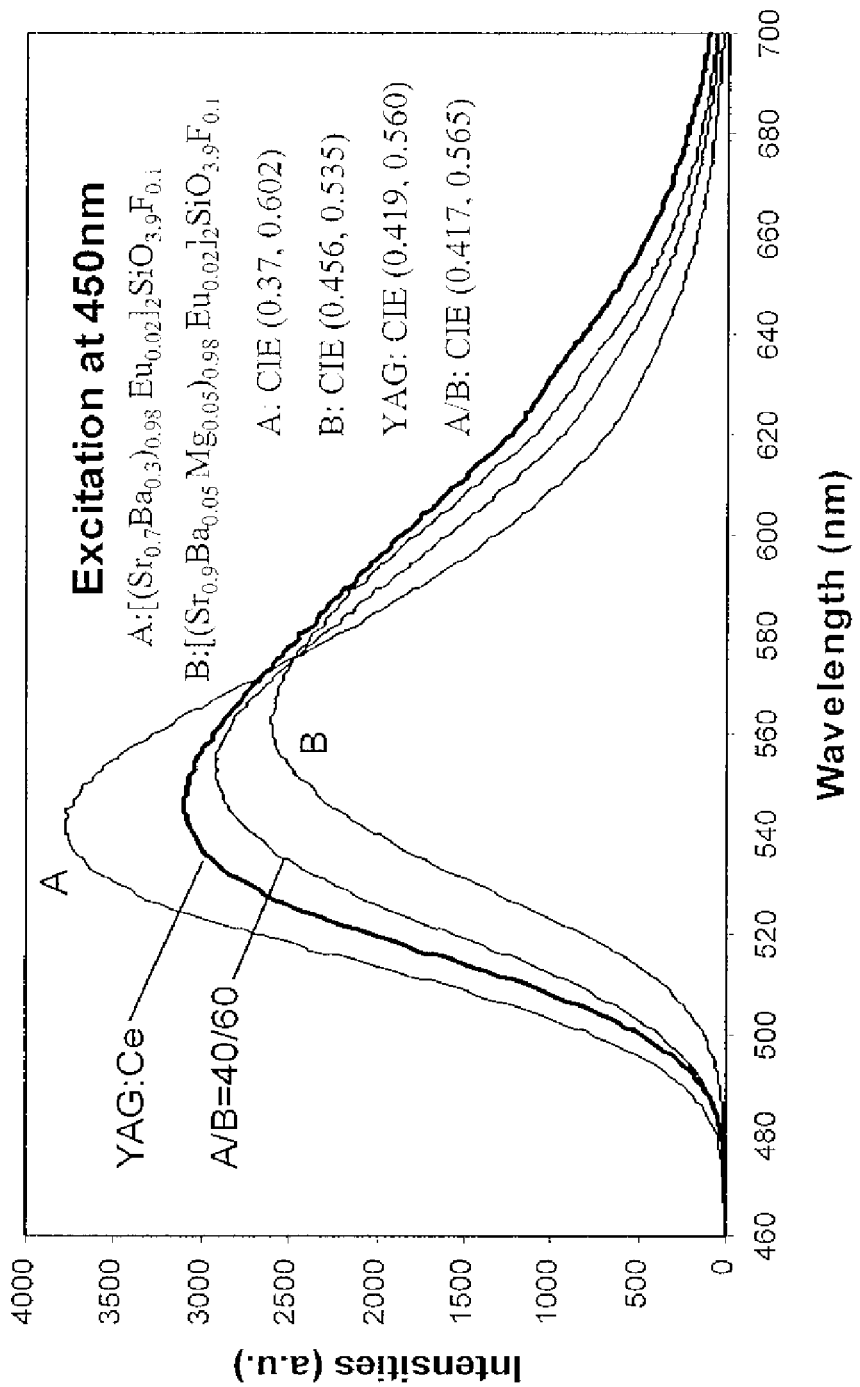
FIG. 8 is a graph of emission intensity as a function of wavelength for compounds having similar CIE color, including novel phosphors prepared by mixing 40% $[(Sr_{0.7}Ba_{0.3})_{0.98}Eu_{0.02}]_2SiO_{3.9}F_{0.1}$ and 60% $[(Sr_{0.9}Ba_{0.05}Mg_{0.05})_{0.98}Eu_{0.02}]_2SiO_{3.9}F_{0.1}$.

(4) To match or improve upon a YAG emission spectrum, it may be necessary in some embodiments of the present invention to mix the inventive silicate phosphors. FIG. 8 shows that a substantially identical CIE color of YAG can be prepared by mixing 40% $[(Sr_{0.7}Ba_{0.3})_{0.98}Eu_{0.02}]_2SiO_{3.9}F_{0.1}$ and 60% $[(Sr_{0.9}Ba_{0.05}Mg_{0.05})_{0.98}Eu_{0.02}]_2SiO_{3.9}F_{0.1}$. The total brightness of the mixture is estimated to be nearly 90% as bright as the YAG composition.

Effects of Temperature and Humidity on the Phosphor

Temperature and humidity effects on the luminescent properties are very important to phosphor-based illumination devices such as white LEDs, based on partial or total conversion of LED emission to other wavelength emissions by the selected phosphor material system. The operating temperature range for such phosphor-based radiation devices depends on the specific application requirements. Temperature stable up to 85° C. are generally required for commercial electronic applications. However, temperatures up to 180° C. are desired for high power LED applications. Stability over the entire humidity range of 0 to 100% is required for almost all commercial electronic applications.

Figure 9:
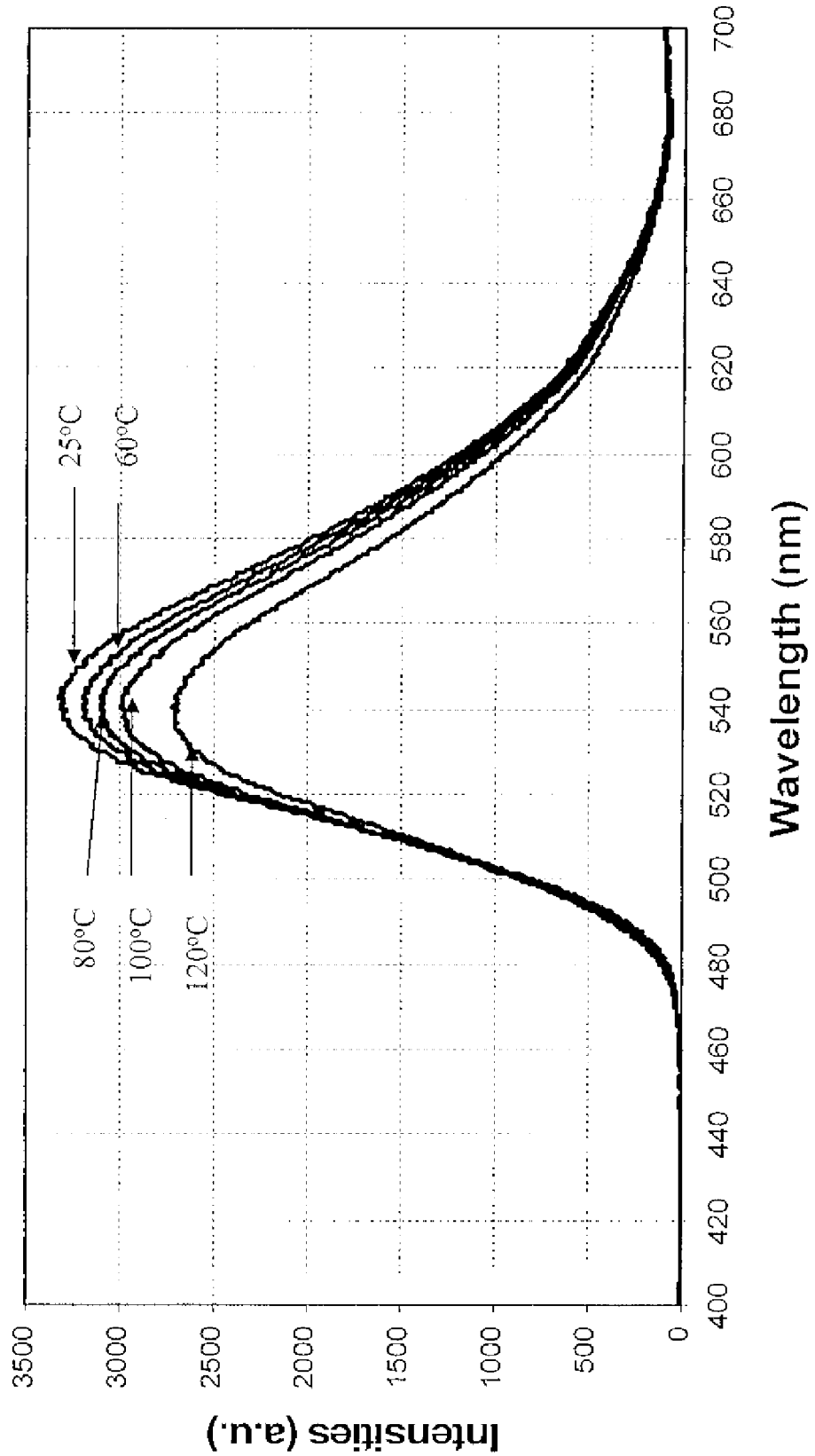
FIG. 9 is a collection of emission spectra of the exemplary phosphor $[(Sr_{0.7}Ba_{0.3})_{0.98}Eu_{0.02}]_2SiO_{3.9}F_{0.1}$ tested as a function of temperature, which ranged from 25 to 120° C.
Figure 10:
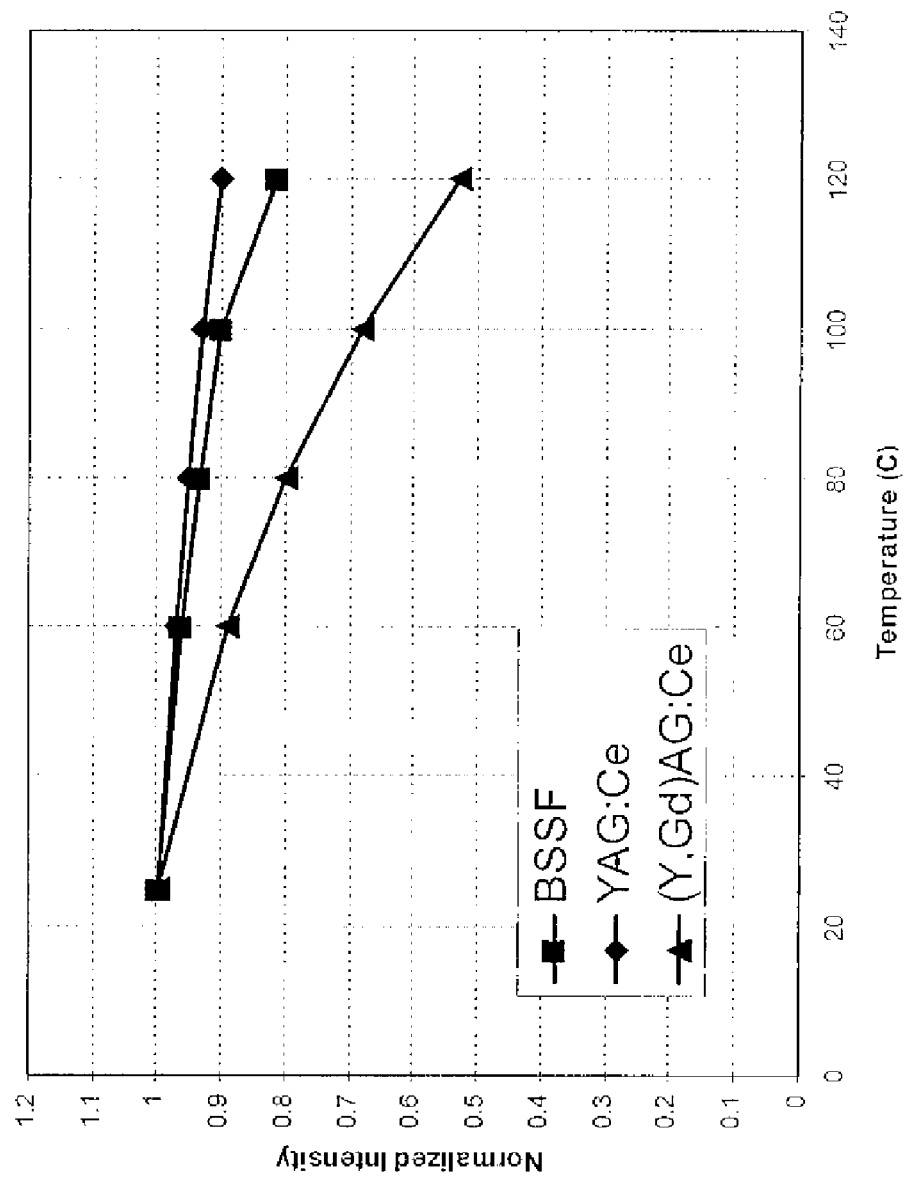
FIG. 10 is a graph of the maximum intensities of the spectra plotted as a function of temperature, where the maximum intensity of the exemplary yellow phosphor $[(Sr_{0.7}Ba_{0.3})_{0.98}Eu_{0.02}]_2SiO_{3.9}F_{0.1}$ is shown compared with a YAG:Ce compound and a (Y,Gd)AG compound.
Figure 11:
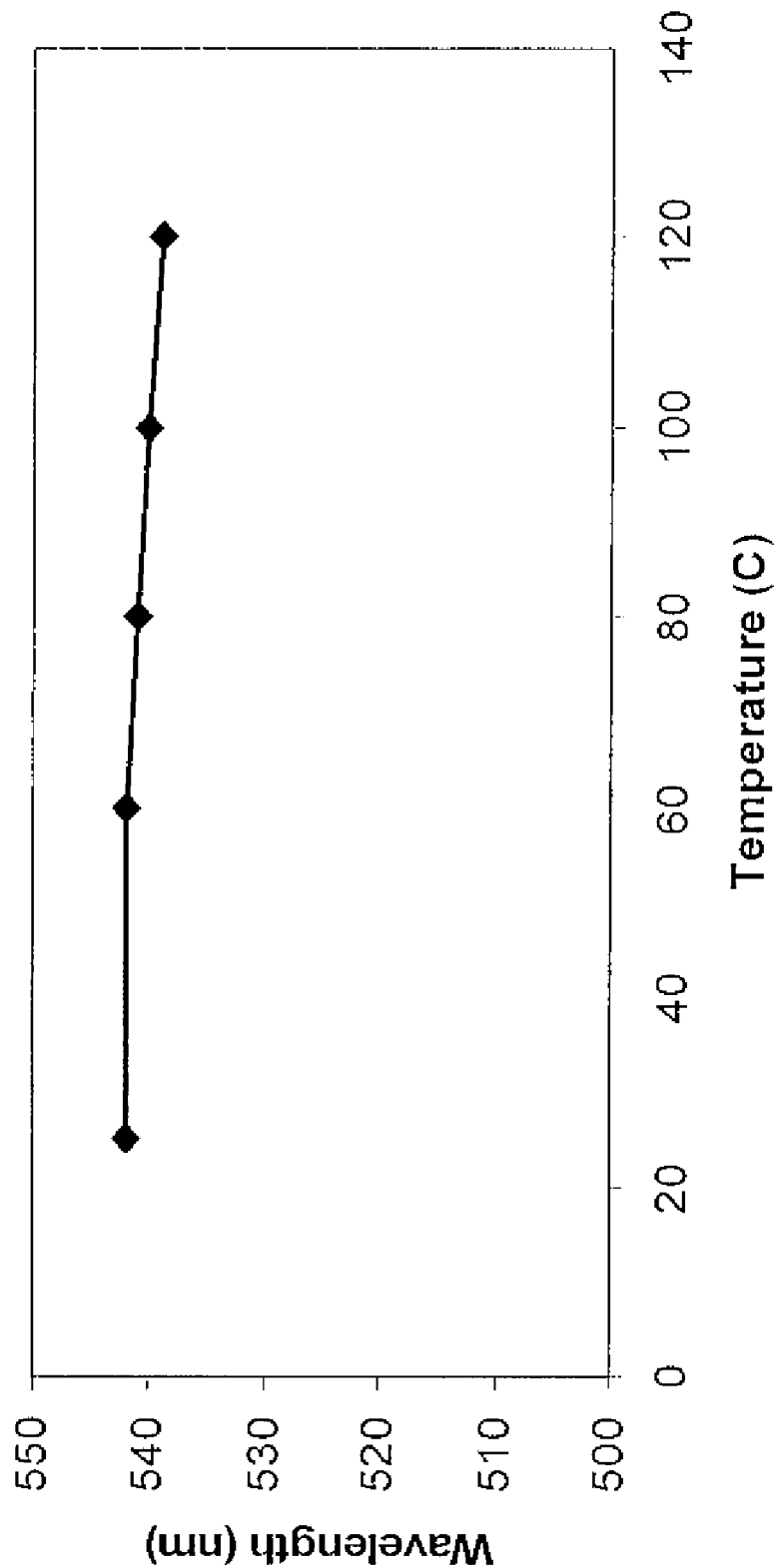
FIG. 11 is a graph of the maximum emission wavelengths of the spectra shown in FIG. 8 plotted as a function of temperature for the exemplary yellow phosphor $[(Sr_{0.7}Ba_{0.3})_{0.98}Eu_{0.02}]_2SiO_{3.9}F_{0.1}$.
Figure 12:
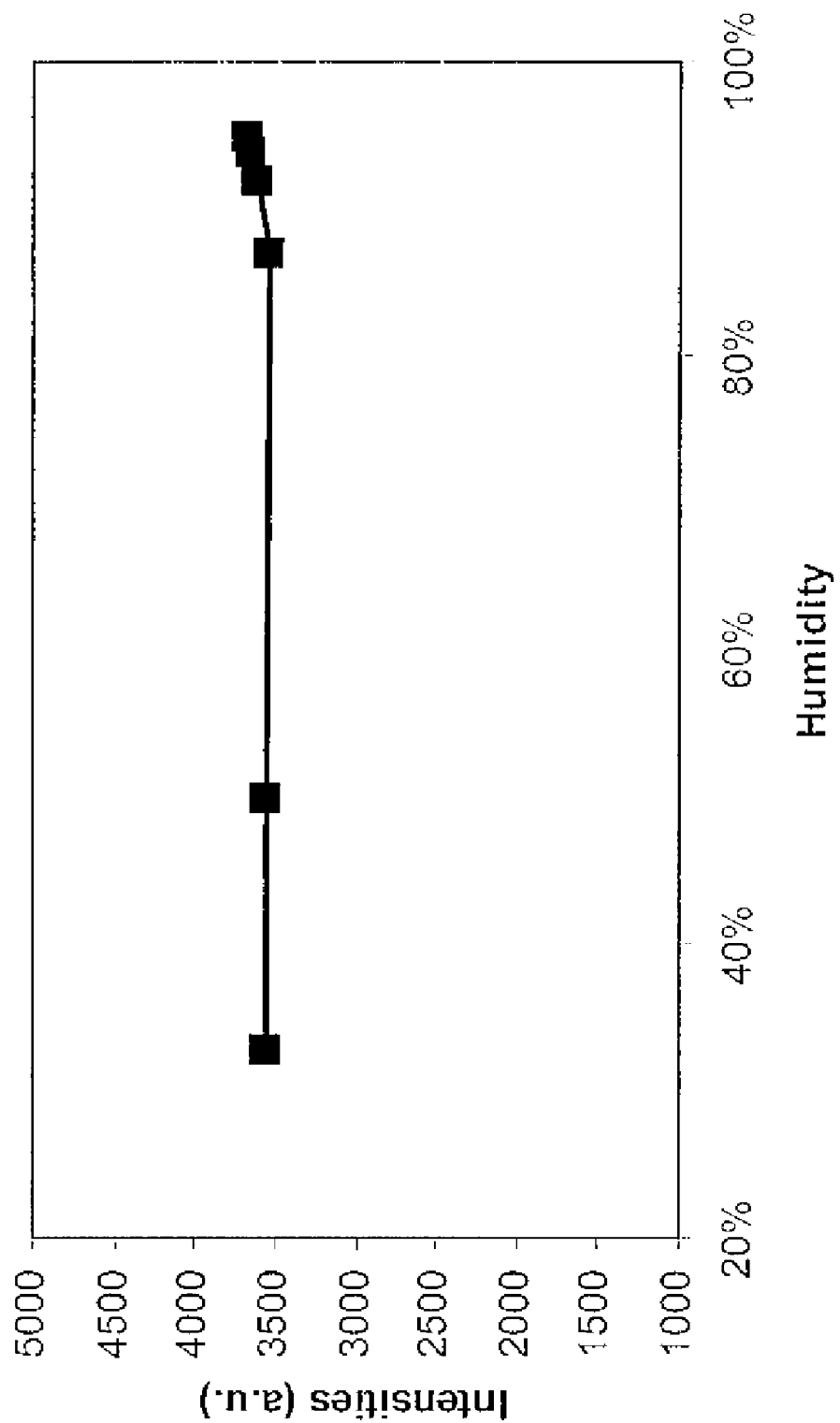
FIG. 12 is a graph of the maximum emission intensity as a function of humidity for the exemplary yellow-green phosphor $[(Sr_{0.7}Ba_{0.3})_{0.98}Eu_{0.02}]_2SiO_{3.9}F_{0.1}$.

FIGS. 9-11 are plots of maximum luminescent intensity either as a function of temperature, or of wavelength for various temperatures, for an exemplary fluorine containing silicate phosphor $(Sr_{0.7}Ba_{0.3}Eu_{0.02})_{1.95}Si_{1.02}O_{3.9}F_{0.1}$. This particular phosphor was derived from the series of emission spectra measured at different temperatures shown previously. The temperature stability of the phosphor of this invention behaves very similar to that of a commercial YAG phosphor, particularly up to 100° C. FIG. 12 shows graph of the stability of the phosphor of this invention for humidity ranging from about 20 to 100%. Without being constrained to any one theory, the inventors believe that while the reason for the 3% increase in emission maximum intensity above 90% humidity is unknown at this time, such a phenomena is reversible when the humidity oscillates between a value of about 90% to 100%.

Phosphor Fabrication Processes

Methods of fabricating the novel silicate-based phosphor of the present embodiments are not limited to any one fabrication method, but may, for example, be fabricated in a three step process that includes: 1) blending starting materials, 2) firing the starting material mix, and 3) various processes to be performed on the fired material, including pulverizing and drying. The starting materials may comprise various kinds of powders, such as alkaline earth metal compounds, silicon compounds, and europium compounds. Examples of the alkaline earth metal compounds include alkaline earth metal carbonates, nitrates, hydroxides, oxides, oxalates, and halides. Examples of silicon compounds include oxides such as silicon oxide and silicon dioxide. Examples of europium compounds include europium oxide, europium fluoride, and europium chloride. As a germanium material for the germanium-containing novel yellow-green phosphors of the present invention, a germanium compound such as germanium oxide may be used.

The starting materials are blended in a manner such that the desired final composition is achieved. In one embodiment, for example, the alkaline-earth, silicon (and/or germanium), and europium compounds are bended in the appropriate ratios, and then fired to achieve the desired composition. The blended starting materials are fired in a second step, and to enhance the reactivity of the blended materials (at any or various stages of the firing), a flux may be used. The flux may comprise various kinds of halides and boron compounds, examples of which include strontium fluoride, barium fluoride, calcium fluoride, europium fluoride, ammonium fluoride, lithium fluoride, sodium fluoride, potassium fluoride, strontium chloride, barium chloride, calcium chloride, europium chloride, ammonium chloride, lithium chloride, sodium chloride, potassium chloride, and combinations thereof. Examples of boron-containing flux compounds include boric acid, boric oxide, strontium borate, barium borate, and calcium borate.

In some embodiments, the flux compound is used in amounts where the number of mole percent ranges from between about 0.1 to 3.0, where values may typically range from about 0.1 to 1.0 mole percent, both inclusive.

Various techniques for mixing the starting materials (with or without the flux) include using a mortar, mixing with a ball mill, mixing using a V-shaped mixer, mixing using a cross rotary mixer, mixing using a jet mill and mixing using an agitator. The starting materials may be either dry mixed or wet mixed, where dry mixing refers to mixing without using a solvent. Solvents that may be used in a wet mixing process include water or an organic solvent, where the organic solvent may be either methanol or ethanol.

The mix of starting materials may be fired by numerous techniques known in the art. A heater such as an electric furnace or gas furnace may be used for the firing. The heater is not limited to any particular type, as long as the starting material mix is fired at the desired temperature for the desired length of time. In some embodiments, firing temperatures may range from about 800 to 1600° C. The firing time may range from about 10 minutes to 1000 hours. The firing atmosphere may be selected from among air, a low-pressure atmosphere, a vacuum, an inert-gas atmosphere, a nitrogen atmosphere, an oxygen atmosphere, an oxidizing atmosphere, and/or a reducing atmosphere. Since $Eu^{2+}$ ions need to be included in the phosphor at some stage of the firing, it is desired in some embodiments to provide a reducing atmosphere using a mixed gas of nitrogen and hydrogen.

Exemplary methods of preparing the present phosphors include a sol-gel method and a solid reaction method. The sol-gel method may be used to produce powder phosphors. A typical procedure comprised the steps of:

1. a) Dissolving certain amounts of alkaline earth nitrates (Mg, Ca, Sr, Ba), and $Eu_2O_3$ and/or $BaF_2$ or other alkaline earth metal halides in dilute nitric acid; and b) Dissolving corresponding amount of silica gel in de-ionized water to prepare a second solution.
2. After the solids of the two solutions of steps 1a) and 1b) above were totally dissolved, the two solutions were mixed and stirred for two hours. Ammonia was then used to generate a gel in the mixture solution. Following formation of the gel, the pH was adjusted to about 9.0, and the gelled solution stirred continuously at about 60° C. for 3 hours.
3. After drying the gelled solution by evaporation, the resulted dry gel was decomposed at 500 to 700° C. for about 60 minutes to decompose and acquire oxides.
4. After cooling and grinding with certain amount of $NH_4F$ or other ammonia halides when alkaline earth metal halides are not used in step 1a), the powder was sintered in a reduced atmosphere for about 6 to 10 hours. The calcining/sintering temperature ranged from about 1200 to 1400° C.

Alternatively, the solid reaction method was also used for silicate-based phosphors. The steps of a typical procedure used for the solid reaction method are as following:

1. Desired amounts of alkaline earth oxides or carbonates (Mg, Ca, Sr, Ba), dopants of $Eu_2O_3$ and/or $BaF_2$ or other alkaline earth metal halides, corresponding $SiO_2$ and/or $NH_4F$ or other ammonia halides were wet mixed with a ball mill.

1. After drying and grinding, the resulting powder was calcined/sintered in a reduced atmosphere for about 6 to 10 hours. The calcining/sintering temperature ranged from 1200 to 1400° C.

Figure 13:
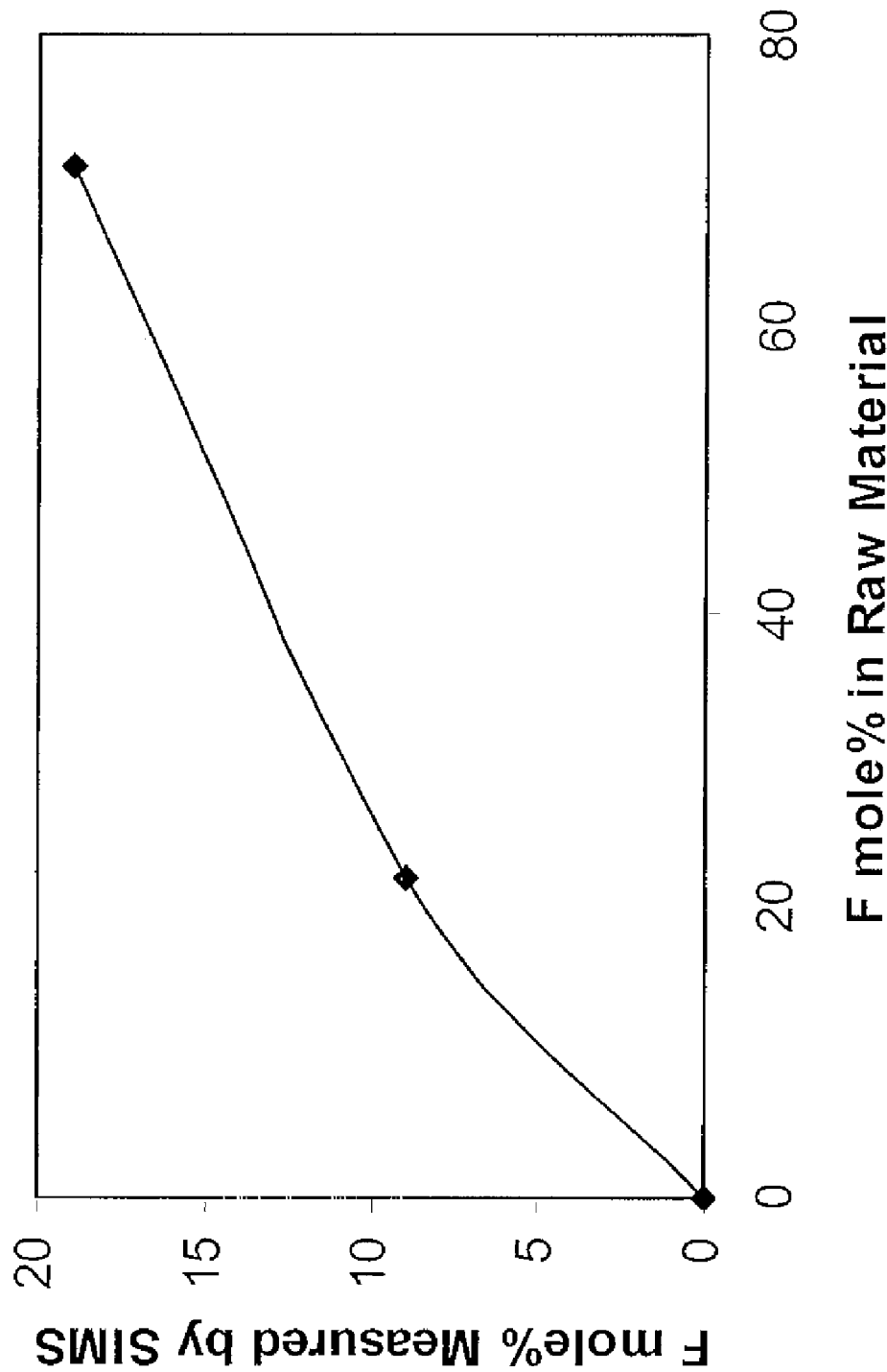
FIG. 13 relates to fabrication of the novel yellow-green phosphor, and is a graph of the fluorine concentration of a starting material in an exemplary sintered phosphor as a function of the mole percent of fluorine that actually ends up in the phosphor, the fluorine content in the sintered phosphor measured by secondary ion emission spectroscopy (SIMS)

In a specific example relating to the preparation of the present phosphors, the concentration of fluorine in the sintered phosphor $[(Sr_{1-x}Ba_x)_{0.98}Eu_{0.02}]_2SiO_{4-y}F_y$ was measured using secondary ion emission spectroscopy (SIMS), and the results are shown in FIG. 13. In this experiment, the fluorine was added to the phosphor as $NH_4F$. The results show that for a mol % of fluorine of about 20 mol % in the starting material, the sintered phosphor ends up with about 10 mol %. When the content of fluorine in the raw material is about 75 mol %, the content of fluorine in the sintered phosphor is about 18 mol %.

Production of White Light Illumination

Figure 14:
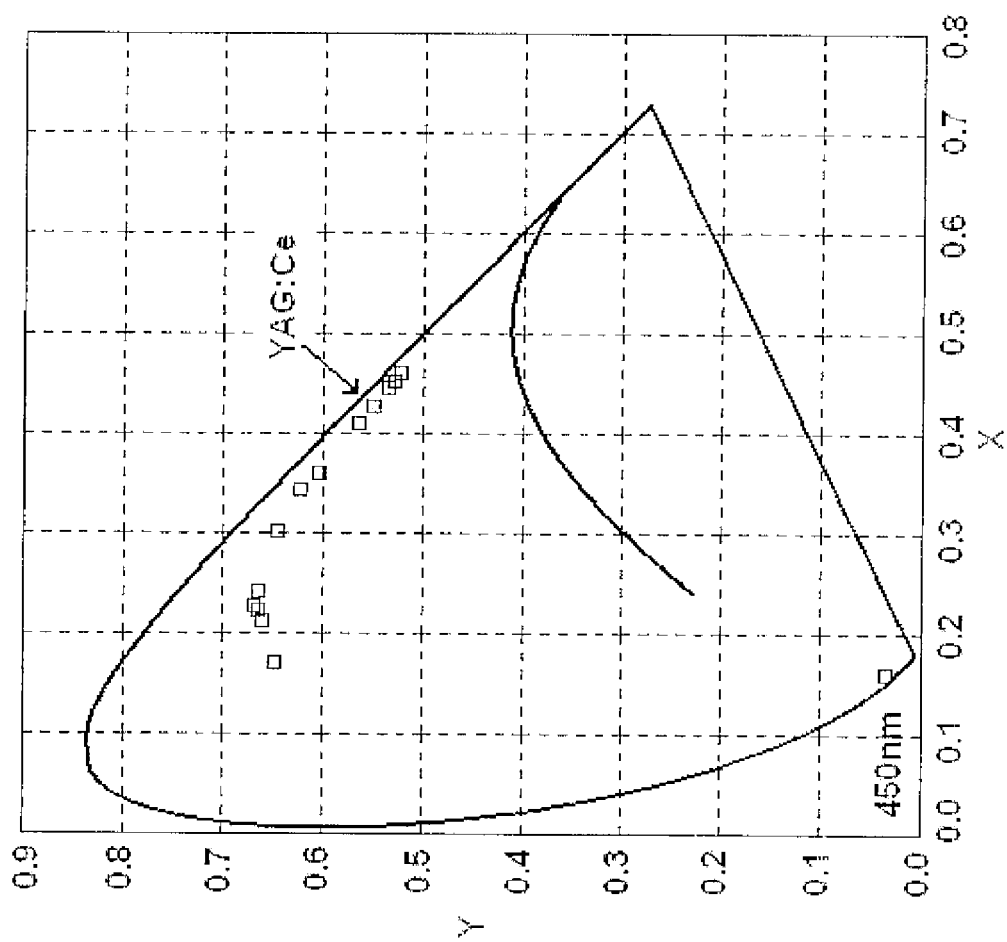
FIG. 14 shows the location of the inventive yellow-green phosphors on a CIE diagram, along with an exemplary YAG:Ce phosphor for comparison.
Figure 17:
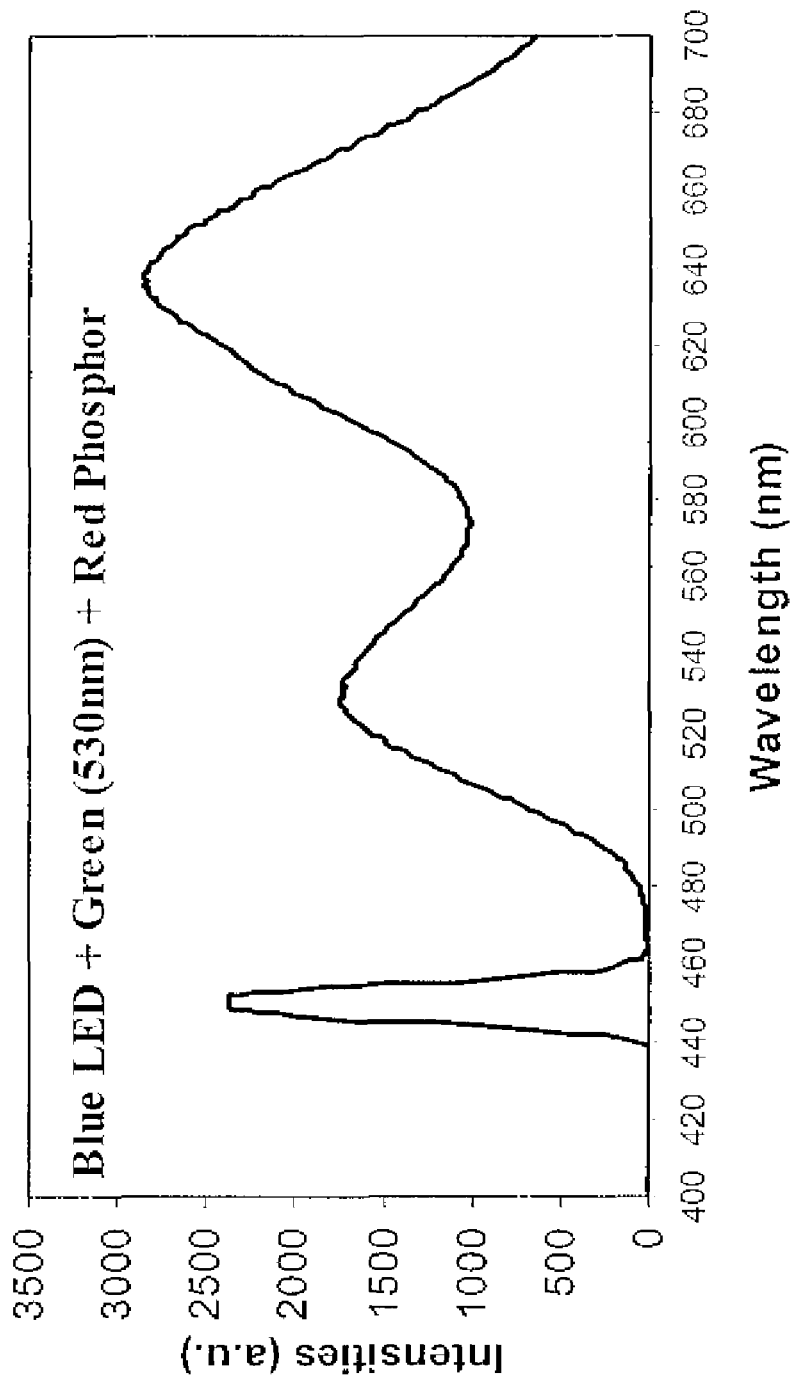
FIG. 17 is an emission spectrum from an exemplary white LED comprising a blue LED (emitting at a peak wavelength of about 450 nm), the inventive yellow-green phosphor this time adjusted to emit more in the green at about 530 nm, and a red phosphor having the formula CaS:Eu.
Figure 18:
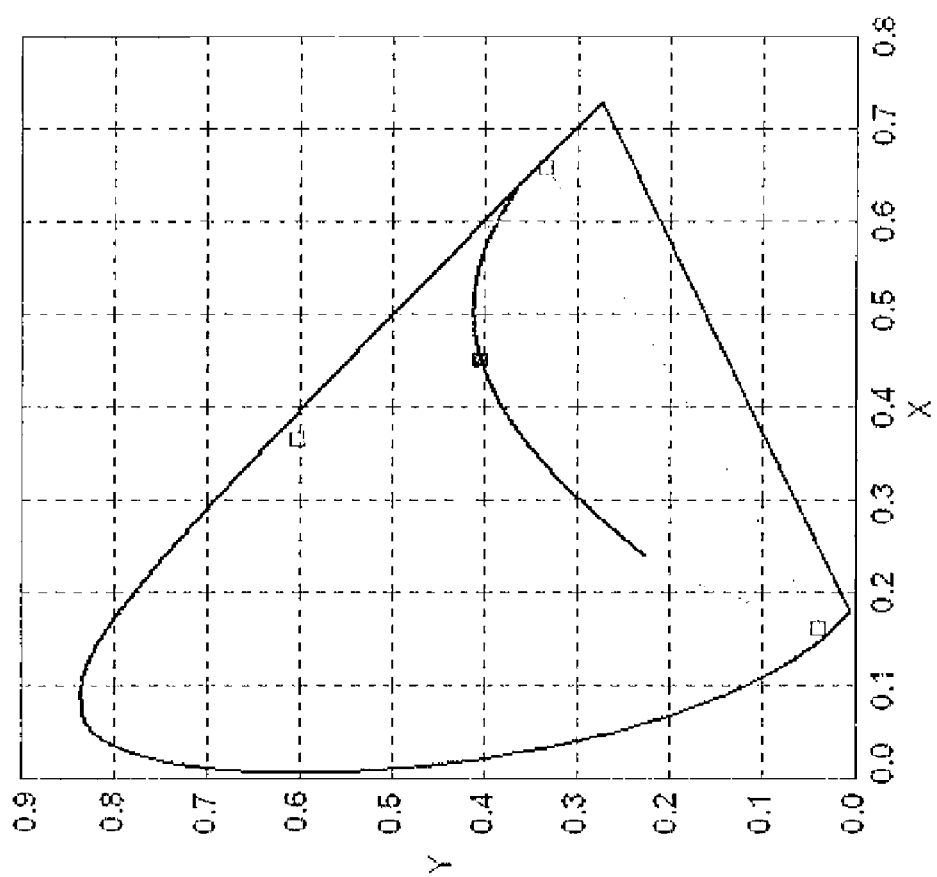
FIG. 18 is a chromaticity diagram showing the positions of an exemplary red, green and yellow phosphor, and the position of the resulting white light created by mixing light from the individual phosphors.

The white light illumination that may be produced using the inventive, novel yellow-green phosphor will be discussed in this final portion of the disclosure. The first section of this final portion will begin with a description of exemplary blue LED's that may be used to excite the inventive yellow-green phosphor. That the present yellow-green phosphors are capable of absorbing, and be excited by, light over a large range of wavelengths, including the blue portion of the visible, is demonstrated by the excitation (absorption) spectra of FIG. 6. Next, a generalized description of the CIE diagram will be provided, along with the location of the inventive yellow-green phosphor on the diagram, as shown in FIG. 14. According to the general scheme of FIG. 1, light from the inventive yellow-green phosphor may be combined with light from the blue LED to make white illumination; the results of such an experiment are shown in an emission intensity versus wavelength plot for this system in FIG. 15. The color rendering of the white light may be adjusted with the inclusion of other phosphors in the system, as exemplified by the spectrum of FIG. 16. Alternatively, the inventive phosphor may be adjusted to emit more in the green, and combined with a red phosphor to make up the phosphor system, which together with the blue light from the blue LED produces the spectrum in FIG. 17. To conclude, the CIE diagram of the resulting white light is shown in FIG. 18.

The Blue LED Radiation Source

According to the present embodiments, the blue light emitting LED emits light having a main emission peak in the wavelength range greater than or equal to about 400 nm, and less than or equal to about 520 nm. This light serves two purposes: 1) it provides the excitation radiation to the phosphor system, and 2) it provides blue light which, when combined with the light emitted from the phosphor system, makes up the white light of the white light illumination.

In an alternative embodiment, the blue LED emits light greater than or equal to about 420 nm, and less than or equal to about 500 nm. In yet another embodiment, the blue LED emits light greater than or equal to about 430 and less than or equal to about 480 nm. The blue LED wavelength may be 450 nm.

The blue light emitting device of the present embodiments is herein described generically as a "blue LED," but it will be understood by those skilled in the art that the blue light emitting device may be at least one of (wherein it is contemplated to have several operating simultaneously) a blue light emitting diode, a laser diode, a surface emitting laser diode, a resonant cavity light emitting diode, an inorganic electroluminescence device and an organic electroluminescence device. If the blue light emitting device is an inorganic device, it may be a semiconductor selected from the group consisting of a gallium nitride based compound semiconductor, a zinc selenide semiconductor and a zinc oxide semiconductor.

FIG. 6 is an excitation spectrum of the present yellow-green phosphors, showing that these novel phosphors are capable of absorbing radiating over a range of about 280 to 520 nm, and relevant to the present embodiments, over a range of about 400 to 520 nm. In preferred embodiments of the present invention, the novel yellow-green phosphors absorb radiation (in other words, are capable of being excited by radiation) ranging from 430 to 480 nm. In yet another embodiment, the phosphor absorbs radiation having a wavelength of about 450 nm.

Next, a generalized description of the CIE diagram will be given, along with a description of where the present yellow-green phosphors appear on the CIE diagram.

Chromaticity Coordinates on a CIE Diagram and the CRI

White light illumination is constructed by mixing various or several monochromatic colors from the visible portion of the electromagnetic spectrum, the visible portion of the spectrum comprising roughly 400 to 700 nm. The human eye is most sensitive to a region between about 475 and 650 nm. To create white light from either a system of LED's, or a system of phosphors pumped by a short wavelength LED, it is necessary to mix light from at least two complementary sources in the proper intensity ratio. The results of the color mixing are commonly displayed in a CIE "chromaticity diagram," where monochromatic colors are located on the periphery of the diagram, and white at the center. Thus, the objective is to blend colors such that the resulting light may be mapped to coordinates at the center of the diagram.

Another term of art is "color temperature," which is used to describe the spectral properties of white light illumination. The term does not have any physical meaning for "white light" LED's, but it is used in the art to relate the color coordinates of the white light to the color coordinates achieved by a black-body source. High color temperature LED's versus low color temperature LED's are shown at www.korry.com.

Chromaticity (color coordinates on a CIE chromaticity diagram) has been described by Srivastava et al. in U.S. Pat. No. 6,621,211. The chromaticity of the prior art blue LED-YAG:Ce phosphor white light illumination system described above are located adjacent to the so-called "black body locus," or BBL, between the temperatures of 6000 and 8000 K. White light illumination systems that display chromaticity coordinates adjacent to the BBL obey Planck's equation (described at column 1, lines 60-65 of that patent), and are desirable because such systems yield white light which is pleasing to a human observer.

The color rendering index (CRI) is a relative measurement of how an illumination system compares to that of a black body radiator. The CRI is equal to 100 if the color coordinates of a set of test colors being illuminated by the white light illumination system are the same as the coordinates generated by the same set of test colors being irradiated by a black body radiator.

Turning now to the present yellow-green phosphors, various exemplary compositions of the novel phosphors were excited with 450 nm radiation, and the positions of their emissions on a CIE diagram are shown in FIG. 14. The position of the 450 nm excitation light is also shown, as well as the position of a YAG:Ce phosphor for comparison.

Figure 15:
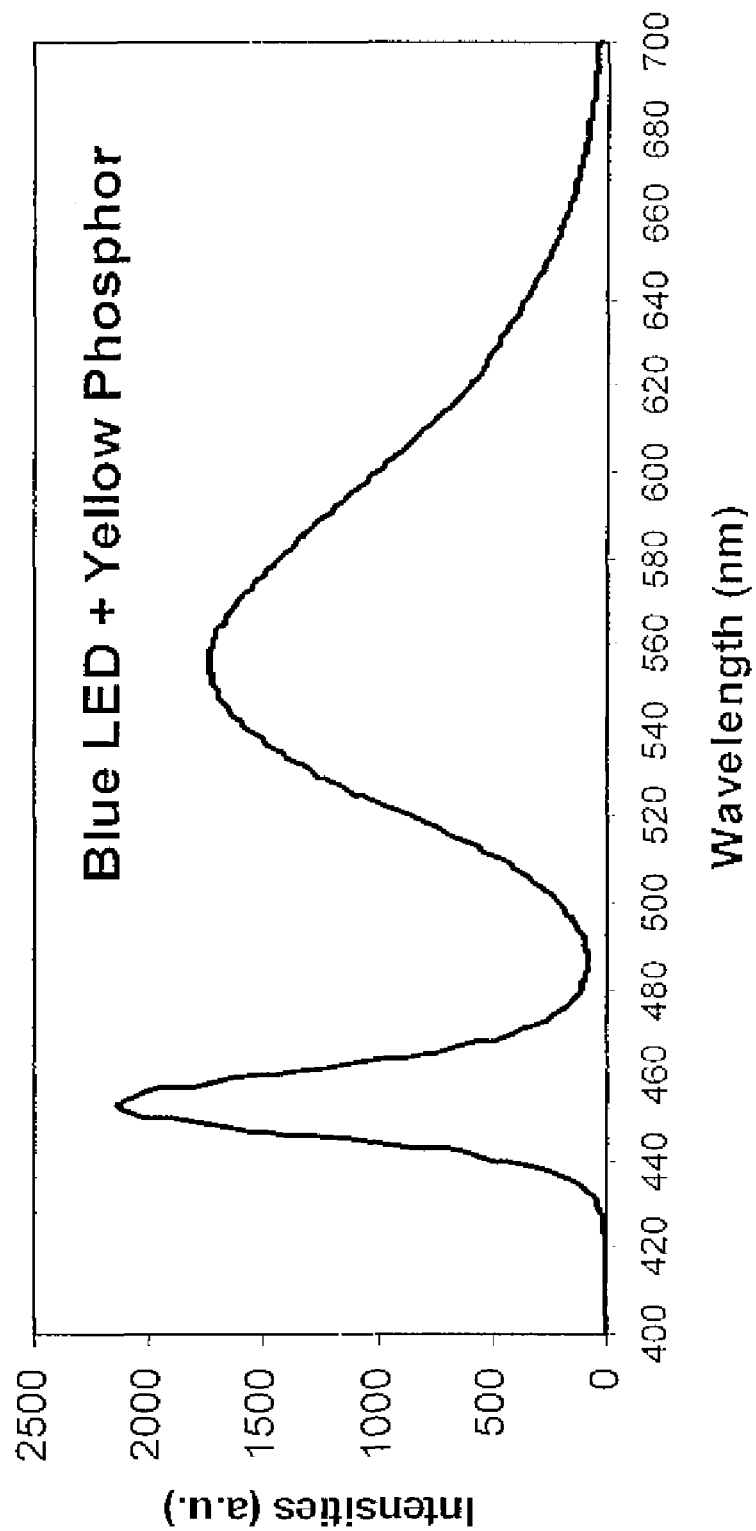
FIG. 15 is an emission spectrum from an exemplary white LED comprising yellow light from an exemplary $(Sr_{0.7}Ba_{0.3}Eu_{0.02})_{1.95}Si_{1.02}O_{3.9}F_{0.1}$ phosphor in combination with blue light from a blue LED (used to provide excitation radiation to the exemplary yellow-green phosphor), the excitation wavelength of the blue LED about 450 nm.

The yellow to yellow-green color of these exemplary phosphors may advantageously be mixed with blue light from the blue LED described above (wherein the blue light has a wavelength ranging from about 400 to 520 nm in one embodiment, and 430 to 480 nm in another embodiment) to construct the white light illumination desired for a multiplicity of applications. FIG. 15 shows the results of mixing light from a blue LED with an exemplary yellow phosphor, in this case the yellow phosphor having the formula $(Sr_{0.7}Ba_{0.3}Eu_{0.02})_{1.95}Si_{1.02}O_{3.9}F_{0.1}$.

It will be understood by those skilled in the art that the present yellow-green phosphor may be used in conjunction with other phosphors, as part of a phosphor system, whereupon the light emitted from each of the phosphors of the phosphor system may be combined with the blue light from the blue LED to construct white light with alternative color temperatures and color renderings. In particular, green, orange and/or red phosphors disclosed previously in the prior art may be combined with the present yellow-green phosphor.

For example, U.S. Pat. No. 6,649,946 to Bogner et al. disclosed yellow to red phosphors based on alkaline earth silicon nitride materials as host lattices, where the phosphors may be excited by a blue LED emitting at 450 nm. The red to yellow emitting phosphors uses a host lattice of the nitridosilicate type $M_xSi_yN_z$:Eu, wherein M is at least one of an alkaline earth metal chosen from the group Ca, Sr, and Ba, and wherein z=⅔ x+4/3y. One example of a material composition is $Sr_2Si_5N_8$:Eu$^{2+}$. The use of such red to yellow phosphors was disclosed with a blue light emitting primary source together with one or more red and green phosphors. The objective of such a material was to improve the red color rendition R9 (adjust the color rendering to red-shift), as well as providing a light source with an improved overall color rendition Ra.

Another example of a disclosure of supplementary phosphors, including red phosphors, that may be used with the present yellow-green phosphor are found in U.S. Patent Application Publication 2003/0006702 to Mueller-Mach, which disclosed a light emitting device having a (supplemental) fluorescent material that receives primary light from a blue LED having a peak wavelength of 470 nm, the supplemental fluorescent material radiating light in the red spectral region of the visible light spectrum. The supplementary fluorescent material is used in conjunction with a main fluorescent material to increase the red color component of the composite output light, thus improving the white output light color rendering. In a first embodiment, the main fluorescent material is a Ce activated and Gd doped yttrium aluminum garnet (YAG), while the supplementary fluorescent material is produced by doping the YAG main fluorescent material with Pr. In a second embodiment, the supplementary fluorescent material is a Eu activated SrS phosphor. The red phosphor may be, for example, $(SrBaCa)_2Si_5N_8$: Eu$^{2+}$. The main fluorescent material (YAG phosphor) has the property of emitting yellow light in response to the primary light from the blue LED. The supplementary fluorescent material adds red light to the blue light from the blue LED and the yellow light from the main fluorescent material.

U.S. Pat. No. 6,504,179 to Ellens et al. disclose a white LED based on mixing blue-yellow-green (BYG) colors. The yellow emitting phosphor is a Ce-activated garnet of the rare earths Y, Tb, Gd, Lu, and/or La, where a combination of Y and Tb was preferred. In one embodiment the yellow phosphor was a terbium-aluminum garnet (TbAG) doped with cerium $(Tb_3Al_5O_{12}$—Ce). The green emitting phosphor comprised a CaMg chlorosilicate framework doped with Eu (CSEu), and possibly including quantities of further dopants such as Mn. Alternative green phosphors were $SrAl_2O_4$:Eu and $Sr_4Al_{14}O_{25}$:Eu$^{2+}$.

The novel yellow-green phosphor may be used in a combination of green and yellow phosphors $(Tb_3Al_5O_{12}$—Ce).

Although a prior art method disclosed in U.S. Pat. No. 6,621,211 to Srivastava et al was designed to emit white light using a non-visible UV LED, this patent is relevant to the present embodiments because of the supplementary green, orange, and/or red phosphors used in the phosphor system. The white light produced in this method was created by non-visible radiation impinging on three, and optionally a fourth, phosphor, of the following types: the first phosphor emitted orange light having a peak emission wavelength between 575 and 620 nm, and preferably comprised a europium and manganese doped alkaline earth pyrophosphate phosphor according to the formula $A_2P_2O_7$:Eu$^{2+}$, Mn$^{2+}$. Alternatively, the formula for the orange phosphor could be written $(A_{1-x-y}Eu_xMn_y)_2P_2O_7$ where $0<x\leq0.2$, and $0<y\leq0.2$. The second phosphor emits blue-green light having a peak emission wavelength between 495 and 550 nm, and is a divalent europium activated alkaline earth silicate phosphor ASiO:Eu$^{2+}$, where A comprised at least one of Ba, Ca, Sr, or Mb. The third phosphor emitted blue light having a peak emission wavelength between 420 and 480 nm, and comprised either of the two commercially available phosphors "SECA," $D_5(PO_4)_3Cl$:Eu$^{2+}$, where D was at least one of Sr, Ba, Ca, or Mg, or "BAM," which may be written as $AMg_2Al_{16}O_{27}$, where A comprised at least one of Ba, Ca, or Sr, or $BaMgAl_{10}O_{17}$:Eu$^{2+}$. The optional fourth phosphor emits red light having a peak emission wavelength between 620 and 670 nm, and it may comprise a magnesium fluorogermanate phosphor MgO*MgF*GeO:Mn$^{4+}$.

The Inventive Yellow Phosphor in Combination with Other Phosphors

In one embodiment of the present invention, a white illumination device can be constructed using a GaN based blue LED having a emission peak wavelength ranging about 430 nm to 480 nm, in combination with the inventive yellow phosphor with an emission peak wavelength ranging from about 540 nm to 580 nm. FIG. 15 is a combination spectra measured from a white illumination device, which consists of a blue LED and the inventive yellow phosphor layer. The conversion efficiency and the amount of the phosphor used in the device directly determines the color coordination of the white illumination devices in CIE diagram. In this case, a color temperature of about 5,000 to 10,000 K with a color coordination where X ranges from 0.25 to 0.40 and Y ranges from 0.25 to 0.40 can be achieved by combining light from the blue LED with light from the inventive yellow phosphor.

Figure 16:
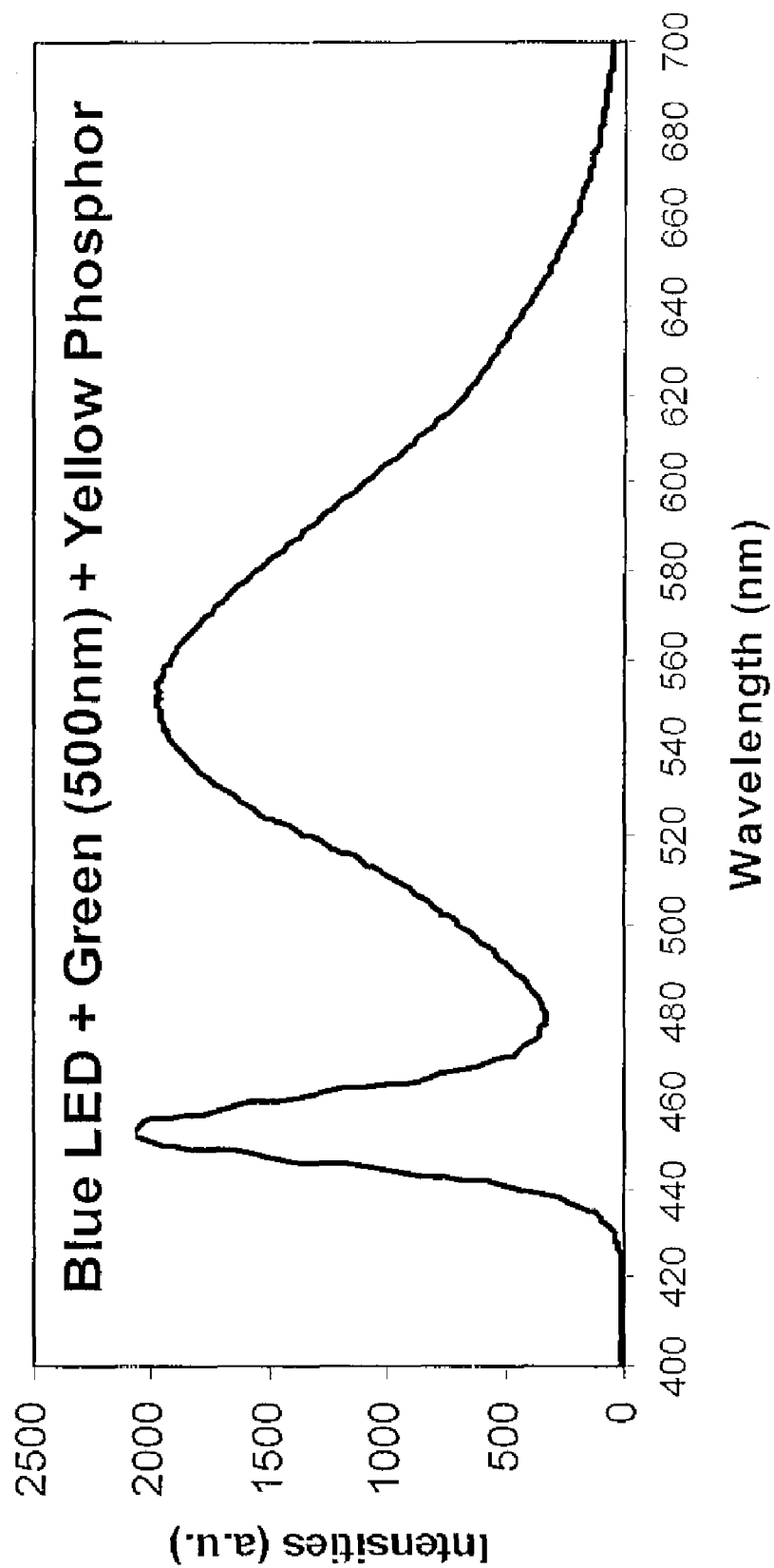
FIG. 16 is an emission spectrum from an exemplary white LED comprising yellow light from the exemplary $(Sr_{0.7}Ba_{0.3}Eu_{0.02})_{1.95}Si_{1.02}O_{3.9}F_{0.1}$ phosphor in combination with green light from an exemplary green phosphor having the formula $(Ba_{0.3}Eu_{0.02})_{1.95}Si_{1.02}O_{3.9}F_{0.1}$, with blue light from the blue LED as before in FIG. 14, the excitation radiation from the blue LED again having a wavelength of about 450 nm.

In another embodiment, a white illumination device may be constructed using a GaN based blue LED having an emission peak wavelength ranging from about 430 nm to 480 nm; the inventive yellow phosphor has an emission peak wavelength ranging from about 540 nm to 580 nm; and an inventive green phosphor having an emission peak wavelength ranging from about 500 nm to 520 nm. The color rendering of the resulting white light has been improved with this solution of mixing green and yellow phosphors. FIG. 16 is a combination spectra measured from a white illumination device comprising the light from a blue LED, and the light from a mixture of the inventive yellow and green phosphors. The conversion efficiency and the amounts of the phosphors used in the device directly determine the color coordination of the white illumination devices in CIE diagram. In this case, a color temperature of 5,000 to 7,000 K with a color rendering greater than 80 was achieved by combining light from the blue LED with light from a mixture of the inventive yellow and green phosphors.

In another embodiment, a white illumination device may be constructed by using a GaN based blue LED having an emission peak wavelength ranging from about 430 nm to 480 nm; the inventive green phosphor having an emission peak wavelength ranging from about 530 nm to 540 nm; and a commercially available red phosphor such as Eu doped CaS having an emission peak wavelength ranging from 600 nm to 670 nm. The color temperature may be adjusted to 3,000 K, and color rendering may be enhanced to a value greater than about 90 using the presently disclosed green and red phosphors. FIG. 17 is a combination spectra measured from a white illumination device comprising a blue LED and the mixture of the inventive green and CaS:Eu phosphors. The conversion efficiency and amount of the phosphor used in the device directly determines the color coordination of the white illumination devices in CIE diagram. In this case the color temperature of 2,500 to 4,000 K with color rendering greater than 85 can be achieved by combining light from the blue LED with light from a mixture of the inventive red and green phosphor system. FIG. 18 shows the position of the resultant white light illumination on a CIE diagram.

The Present Yellow-Green Silicates with New Nitride-Based Red Phosphors in White LEDs The present yellow-green silicates may be advantageously combined with the newer, nitride-based "deep-red" phosphors in white LED systems. The positions of these new nitrides on the CIE chromaticity diagram, lying as they do at very long red wavelengths, even approaching the near infrared, nicely complement the yellow-green emissions of the present oxygen substituted phosphors and the blue light from, for example, any suitable II-V, II-VI, or IV-IV semiconducting diode. The resultant white light has better color rendering characteristics, to name one advantage.

Earlier versions of these deep red phosphors were based on nitrides of silicon, and hence may be generically referred to as "nitride-based" silicates or nitridosilicates. Newer versions have included aluminum to provide the compounds "nitridoaluminosilicate nitrides." The inclusion of oxygen into these crystals, deliberate or otherwise, may also give to the desired deep red phosphors, even though similar compounds known as "SiAlONs" in some cases are sources of green and yellow-green illumination. When oxygen substitutes for nitrogen the resulting compound is an "oxynitrides."

As alluded to earlier, a combination of LED-generated blue light, and phosphor-generated light, may be used to produce the white light from a so-called "white LED." The phosphor-generated light, according to the present embodiments, comprises both a yellow-green light from one of the silicate-based yellow-green phosphors described above, and one of the newer "deep red" type phosphors generally having a nitride host structure, such a structure optionally having aluminum (Al) partially replacing silicon (Si) in one embodiment, and oxygen (O) partially replacing nitrogen (N) in another. Nitrides and oxynitrides, each with and without aluminum, are contemplated by the present embodiments. A blue emitting LED, such as one providing excitation radiation ranging from about 400 to 480 nm, is deemed to be particularly suitable for exciting both the yellow-green and the red phosphors.

Previously known white light generating systems used a blue LED in conjunction with a yellow emitting, cerium-doped, yttrium aluminum garnet known as "YAG," having the formula $Y_3Al_5O_{12}:Ce^{3+}$. Such systems have correlated temperatures (CCTs) of greater than about 4,500 K, and color rendering indexes (CRIs) ranging from about 75 to 82. It is believed the present embodiments provide general illumination sources having higher CRIs and lower CCTs. One method of achieving this flexibility of design in blue LED-based devices is to provide a wider separation of the yellow-green and red phosphors relative to one another in CIE space, where these two apexes of a triangle formed with the light from the blue LED create a rich diversity of components for white light generation.

As described in U.S. Pat. No. 7,252,787 to D. Hancu et al., deep red sources were used with YAG and TAG-based yellow sources to produce a high color rendering index have included nitrides having the formula $(Ba,Sr,Ca)_xSi_yN_z:Eu^{2+}$, where each of the x, y, and z parameters was greater than zero. A disadvantage of such phosphors used with YAG/TAG was that they reabsorb emissions from those phosphors due to overlapping of the $Eu^{2+}$ absorption bands with the emission of the $(Tb,Y)_3Al_5O_{12}:Ce^{3+}$) phosphors. Thus, there is a need for red phosphors having a redder emission than these nitrides to produce white light illumination with high CRI.

Host lattices for new red-emitting phosphors based on nitridosilicate compounds were introduced in the mid-1990's. Such phosphors have desirable mechanical and thermal properties due to a three dimensional network of cross-linked SiN4 tetrahedra in which alkali earth ions (M=Ca, Sr, and Ba) are incorporated. The formula used in U.S. Pat. No. 6,649,946 to Bogner et al. to describe such phosphors was $MxSi_yNz$, where M was at least one of an alkaline earth metal, and where z=2/x+⁴⁄₃y. The nitrogen of these nitrides increased the content of covalent bonding, and thus ligand-field splitting. This lead to a pronounced shift of excitation and emission bands to longer wavelengths in comparison to oxide lattices.

The effect of the alkaline earth component of such nitridosilicates when y is 5 was investigated by Y. Q. Li et al. in "Luminescence properties of red-emitting $M_2Si_5N_8:Eu^{2+}$ (M=Ca, Sr, Ba) LED conversion phosphors," *J. of Alloys and Compounds* 417 (2006), pp. 273-279. Polycrystalline powders were prepared by a solid state reaction mechanism. The crystal structure of the Ca-containing member of this family was monoclinic with space group Cc, whereas the Sr and Ba members were isostructural (orthorhombic with space group $Pmn2_1$), with the formation of a complete solid solution between the Sr and Ba end-members.

The position of the 5d excitation bands of the $Eu^{2+}$ ions in these compounds at low energies is attributable to the influence of the highly covalent nature of the europium on an alkaline earth metal site with nitrogen atoms, leading to a large crystal field splitting, as well, also due to the presence of nitrogen. The covalency of the Eu—N bond and the resultant crystal field strength around the $Eu^{2+}$ ions is similar in each of the members of this series (e.g., Ca, Sr, and Ba-based), despite the fact there are two M sites with different symmetries. Of particular importance to white LEDs is the fact these compounds have efficient excitation in the same spectral region (400 to 470 nm), matching the radiative blue light from an InGaN-based LED, which emits around 465 nm. Their broad-band emissions are due to a $4f^65d^1 \rightarrow 4f^7$ transition within the $Eu^{2+}$ ion, with the Ca compound emitting at wavelengths ranging from about 605-615 nm, Sr at 609-680 nm, and Ba at 570-680 nm. For $M_2Si_5N_8:Eu^{2+}$ with M restricted to Sr and Ba, the emission band of $Eu^{2+}$ successively shifts from orange when M is Sr, and yellow when M is Ba at low Eu concentrations, to red (up to 680 nm) for high concentrations of Eu.

As taught by Li et al., the excitation spectra are not substantially dependent on the type of alkaline earth, but the position of the emission bands are. The peak emission bands for a 1 mole percent activator concentration were 605, 610, and 574 nm, for M=Ca, Sr, and Ba. The shift in the emission band with the nature of the alkaline earth is due to a difference in the Stokes shift for each of the members, where the Stokes shift gradually increases with the sequence Ca>Sr>Ba, and this trend is predictable if one observes that the relaxation of the $4f^65d^1$ state becomes less restricted when the size of the alkaline-earth ion decreases. Further, the Stokes shift increases for as the Eu concentration is increased in all cases.

Aluminonitridosilicates may be derived from nitridosilicates by substitutions of aluminum for silicon. A new red phosphor having the formula $Ca_2AlSiN_3$ has been described by K. Uheda et al. in "Luminescence properties of a red phosphor, $CaASiN_3:Eu^{2+}$, for white light-emitting diodes," in *Electrochemical and solid-state letters*, 9 (4) (2006), pages H22-H25. The crystal structure of the $CaAlSiN_3:Eu^{2+}$ was found to be orthorhombic with a Cmc21 space group, where the unit cell volume expanded linearly with an increase in Eu concentration up to at least 20 mole percent. The structure is made up of tetrahedra of $[SiN_4]$ and $[AlN_4]$ forming corner sharing six-member rings; rings are combined to form sheets, of which there are two types. The overall structure is made up of overlaying sheets rotated 180 degrees to one another, forming a rigid three-dimensional framework, with the $Ca^{2+}$ ions accommodated in cavities in the overlaid planes, and where the $Eu^{2+}$ ions substitute for the $Ca^{2+}$ ions. Two thirds of the N atoms are coordinated with three Si atoms, and the remaining N atoms are coordinated with two Si atoms. This is to be contrasted with the nitridosilicate phosphor $CaSiN_2:Eu^{2+}$ described earlier, where all the N atoms are coordinated with two Si atoms. As a result, $CaAlSiN_3:Eu^{2+}$ has a more rigid structure than $CaSiN_2:Eu^{2+}$.

As taught by Uheda et al., the excitation spectra of the aluminonitridosilicate $CaAlSiN_3:Eu^{2+}$, like the nitridosilicate $Ca_2Si5N_8:Eu^{2+}$, shows a broad excitation band that extends to the visible region. This feature means that $CaAlSiN_3:Eu^{2+}$ is also suitable for excitation by a blue or near-UV LED. Under excitation conditions ranging from at least about 250 to 500 nm, the luminescence of this nitridoaluminosilicate shows a single band typical of a 5d-4f transition of $Eu^{2+}$. Under 405 nm excitation, the phosphor exhibits a peak emission at about 660 nm, and the emission looks deep red. With an increase in Eu concentration, the emission peak shifts toward longer wavelengths, and quantum output reaches a maximum at about 1.6 mole percent. The quantum output is about 1.5 times that of the YAG class of aluminates, $(Y,Gd)_3(Al,Ga)_5O_{12}:Ce^{3+}$, under 460 nm excitation.

Further discussion of the phosphor expressed by the formula $(Ca,Eu)AlSiN_3$, and described as a "nitride crystalline red fluorescent material," was disclosed in U.S. Pat. No. 7,253,446 to Sakuma et al. (such phosphors could be described by the formula $Ca_{1-p}AlSiN3:Eu^{2+}_p$ to quantify europium content). They could be excited over a wide range of light, from violet (about 400 nm) to blue (about 480 nm), though they were preferably (meaning most efficiently) excited at a central, 450 nm wavelength in that range. X-ray diffraction confirmed a crystalline phase equivalent to $CaAlSiN_3$. The peak emission of this phosphor was located at about 650 nm (or slightly longer), with an emission intensity of about 184 percent greater than the YAG reference $(Y,Gd)_3Al_5)_{12}:Ce^{3+}$.

US 2006/0255710 to Mueller-Mach et al. teach a class of phosphor materials based on rare earth metal-activated luminescence of an aluminum-substituted oxonitridosilicate. The phosphor comprises a host lattice where the main components are silicon, aluminum, nitrogen, and oxygen. The host lattice has a structure comprising stacks of layers of $[(Al,Si)_2N_{6/3}(N,O)_{2/2}]$, where the silicon and aluminum are surrounded by oxygen and nitrogen in a tetrahedral fashion.

The phosphor described by Mueller-Mach et al. conforms to the general formula $(Ca_{1-x-y-z}Sr_xBa_yMg_z)_{1-n}(Al_{1-a+b}B_z)Si_{1-b}N_{3-b}O_b:RE_n$, where $0 \leq x \leq 1$; $0 \leq y \leq 1$; $0 \leq z \leq 1$; $0 \leq a \leq 1$; $0 \leq b \leq 1$; and $0.002 \leq n \leq 0.2$ and RE is selected from $Eu^{2+}$ and $Ce^{3+}$.

The CIE color coordinates of an Sr-based exemplary phosphor reported by Mueller-Mach et al. are x=0.68 and y=0.318, the phosphor having the formula $Ca_{0.95}Sr_{0.05}AlSi(N,O)_3:Eu(2\%)$. A similar Ba-based phosphor having the formula $Ca_{0.95}Ba_{0.05}AlSi(N,O)_3:Eu(2\%)$ has x and y coordinates 0.676 and 0.323, respectively. The emission peak of the Sr-based phosphor is at 657 nm; that of the Ba-based phosphor is 658 nm. When B is substituted for Al, as in the formula $CaAl_{0.98}B_{0.02}Si(N,O)_3:Eu(2\%)$, x and y are 0.667 and 0.323, respectively, and the peak emission is at 650 nm. A higher concentration of B, as in the formula $CaAl_{0.95}B_{0.05}Si(N,O)_3:Eu(2\%)$, has x and y values of 0.663 and 0.336, respectively, with a peak emission at 654 nm. For comparison, the compound $CaAlSi(N,O)_3:Eu(2\%)$ has x=0.657, y=0.342, and a peak emission at 652 nm.

Mueller-Mach et al. point out advantages of using these oxonitridoaluminosilicates in conjunction with other phosphors in a white LED system. The advantages include 1) these red emitting oxonitridoaluminosilicates do not degrade when used in high humidity environments, 2) they are stable when driven at high current, or operated at high temperature, 3) they may be configured to emit a deeper red light (longer wavelength) relative to previous red phosphors, and 4) they may be readily combined with other phosphors, such as the present yellow-green silicates.

In summary, the present yellow-green silicates may be combined with a red phosphor selected from the group consisting of a nitridosilicate, an oxynitridosilicate, a nitridoaluminosilicate, and an oxynitridoaluminosilicate. Specific examples of these red phosphors are $M_xSi_yN_z:Eu^{2+}$ where M is selected from the group consisting of Ca, Sr, Ba, and Zn; and $Z = \frac{2}{3}x + \frac{4}{3}y$;

$M_2Si_5N_8:Eu$ where M is Ca, Sr, and Ba;
$CaSiN_2:Eu^{2+}$
$CaAlSiN_3:Eu^{2+}$; and
$(Ca_{1-x-y-z}Sr_xBa_yMg_z)_{1-n}(Al_{1-a+b}B_a)Si_{1-b}N_{3-b}O_b:RE_n$, where $0 \leq x \leq 1$, $0 \leq y \leq 1$, $0 \leq z \leq 1$, $0 \leq a \leq 1$, $0 < b \leq 1$, $0.002 \leq n \leq 0.2$, where RE is selected from the group consisting of $Eu^{2+}$ and $Ce^{3+}$.

Many modifications of the exemplary embodiments of the invention disclosed above will readily occur to those skilled in the art. Accordingly, the invention is to be construed as including all structure and methods that fall within the scope of the appended claims.

What is claimed is:

1. A white LED comprising:
   a radiation source configured to emit radiation having a wavelength ranging from about 410 to 500 nm;
   a green phosphor having the formula $(Sr_{1-x-y}Ba_xM_y)_2SiO_4:Eu^{2+}F,Cl,Br,I,S,N,B$, where M is at least one of an element selected from the group consisting of Ca, Mg, Zn, and Cd; where F, Cl, Br, I, S, N, B are used in any combination having a total molar dopant level in the range 0.0001-0.2; and where
   $0.3 \leq x \leq 1$;
   $0 \leq y \leq 0.5$ when M is Ca;
   $0 \leq y \leq 0.1$ when M is Mg; and
   $0 \leq y \leq 0.5$ when M is selected from the group consisting of Zn and Cd, the green phosphor configured to absorb at least a portion of the radiation from the radiation source and emit light with peak intensity in a wavelength ranging from about 500 to 540 nm;

a red phosphor selected from the group consisting of
CaS:Eu$^{2+}$;
SrS:Eu$^{2+}$;
MgO*MgF*GeO:Mn$^{4+}$;
a nitridosilicate, an aluminonitridosilicate, an oxynitridosilicate, and an oxynitridoaluminosilicate;
M$_x$Si$_y$N$_z$:Eu$^{2+}$ where M is selected from the group consisting of Ca, Sr, Ba, and Zn; and Z=⅔x+4/3y;
M$_2$Si$_5$N$_8$:Eu$^{2+}$, where M is Ca, Sr, and Ba;
CaSiN$_2$:Eu$^{2+}$;
CaAlSiN$_3$:Eu$^{2+}$;
(Ca$_{1-x-y-z}$Sr$_x$Ba$_y$Mg$_z$)$_{1-n}$(Al$_{1-a+b}$B$_a$)Si$_{1-b}$N$_{3-b}$O$_b$:RE$_n$, where $0 \leq x \leq 1$, $0 \leq y \leq 1$, $0 \leq z \leq 1$, $0 \leq a \leq 1$, $0 < b \leq 1$, $0.002 \leq n \leq 0.2$, and RE is selected from the group consisting of Eu$^{2+}$ and Ce$^{3+}$; and
wherein the red phosphor is configured to absorb at least a portion of the radiation from the radiation source and emit light with peak intensity in a wavelength ranging from about 590 to 690 nm.

2. A white LED comprising:
a radiation source configured to emit radiation having a wavelength ranging from about 410 to 500 nm;
a yellow phosphor having the formula (Sr$_{1-x-y}$Ba$_x$M$_y$)$_2$SiO$_4$:Eu$^{2+}$F,Cl,Br,I,S,N,B, where M is at least one of an element selected from the group consisting of Ca, Mg, Zn, Cd; where F, Cl, Br, I, S, N, B are used in any combination having a total molar dopant level in the range 0.0001-0.2; and where
$0.3 \leq x \leq 1$;
$0 \leq y \leq 0.5$ when M is Ca;
$0 \leq y \leq 0.1$ when M is Mg; and
$0 \leq y \leq 0.5$ when M is selected from the group consisting of Zn and Cd, the yellow phosphor configured to absorb at least a portion of the radiation from the radiation source and emit light with a peak intensity in a wavelength ranging from about 540 to 590 nm
a red phosphor selected from the group consisting of
CaS:Eu$^{2+}$;
SrS:Eu$^{2+}$;
MgO*MgF*GeO:Mn$^{4+}$;
a nitridosilicate, an aluminonitridosilicate, an oxynitridosilicate, and an oxynitridoaluminosilicate;
M$_x$Si$_y$N$_z$:Eu$^{2+}$ where M is selected from the group consisting of Ca, Sr, Ba, and Zn; and Z=⅔x+4/3y;
M$_2$Si$_5$N$_8$:Eu$^{2+}$, where M is Ca, Sr, and Ba;
CaSiN$_2$:Eu$^{2+}$;
CaAlSiN$_3$:Eu$^{2+}$;
(Ca$_{1-x-y-z}$Sr$_x$Ba$_y$Mg$_z$)$_{1-n}$(Al$_{1-a+b}$B$_a$)Si$_{1-b}$N$_{3-b}$O$_b$:RE$_n$, where $0 \leq x \leq 1$, $0 \leq y \leq 1$, $0 \leq z \leq 1$, $0 \leq a \leq 1$, $0 < b \leq 1$, $0.002 \leq n \leq 0.2$, and RE is selected from the group consisting of Eu$^{2+}$ and Ce$^{3+}$; and
wherein the red phosphor is configured to absorb at least a portion of the radiation from the radiation source and emit light with peak intensity in a wavelength ranging from about 590 to 690 nm.

\* \* \* \* \*